United States Patent
Yeh et al.

(10) Patent No.: US 11,948,837 B2
(45) Date of Patent: Apr. 2, 2024

(54) SEMICONDUCTOR STRUCTURE HAVING VERTICAL CONDUCTIVE GRAPHENE AND METHOD FOR FORMING THE SAME

(71) Applicant: TAIWAN SEMICONDUCTOR MANUFACTURING COMPANY, LTD., Hsinchu (TW)

(72) Inventors: Ching-Fu Yeh, Hsinchu (TW); Chin-Lung Chung, Hsinchu (TW); Shu-Wei Li, Hsinchu (TW); Yu-Chen Chan, Hsinchu (TW); Shin-Yi Yang, Hsinchu (TW); Ming-Han Lee, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 226 days.

(21) Appl. No.: 17/461,363

(22) Filed: Aug. 30, 2021

(65) Prior Publication Data
US 2023/0064444 A1    Mar. 2, 2023

(51) Int. Cl.
H01L 21/76     (2006.01)
H01L 21/768    (2006.01)
H01L 23/532    (2006.01)

(52) U.S. Cl.
CPC .... *H01L 21/76877* (2013.01); *H01L 21/7684* (2013.01); *H01L 21/76844* (2013.01); *H01L 23/53276* (2013.01); *H01L 21/76846* (2013.01)

(58) Field of Classification Search
None
See application file for complete search history.

(56) References Cited

U.S. PATENT DOCUMENTS

| | | | | |
|---|---|---|---|---|
| 9,117,885 B2 * | 8/2015 | Saito | ............. | H01L 21/76847 |
| 9,379,060 B2 * | 6/2016 | Miyazaki | ......... | H01L 23/53276 |
| 9,431,346 B2 * | 8/2016 | Bao | .................... | H01L 23/5256 |
| 2017/0062345 A1 * | 3/2017 | Saito | ............. | H01L 23/53295 |

* cited by examiner

*Primary Examiner* — Bradley Smith
(74) *Attorney, Agent, or Firm* — Birch, Stewart, Kolasch & Birch, LLP

(57) ABSTRACT

A method for making a semiconductor structure includes: providing a substrate with a contact feature thereon; forming a dielectric layer on the substrate; etching the dielectric layer to form an interconnect opening exposing the contact feature; forming a metal layer on the dielectric layer and outside of the contact feature; and forming a graphene conductive structure on the metal layer, the graphene conductive structure filling the interconnect opening, being electrically connected to the contact feature, and having at least one graphene layer that extends in a direction substantially perpendicular to the substrate.

20 Claims, 31 Drawing Sheets

SEMICONDUCTOR STRUCTURE HAVING VERTICAL CONDUCTIVE GRAPHENE AND METHOD FOR FORMING THE SAME

BACKGROUND

The semiconductor integrated circuit (IC) industry has over the past decades experienced tremendous advancements and is still experiencing vigorous development. With the dramatic advances in IC design, new generations of ICs have smaller and more complex circuits. Damascene process, such as single damascene or dual damascene, is one of the techniques used for forming BEOL (back-end-of-line) interconnect structures. The interconnect structures play an important role in miniaturization and electrical performance of the new generations of ICs. Thus, the industry pays much attention on development of the interconnect structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
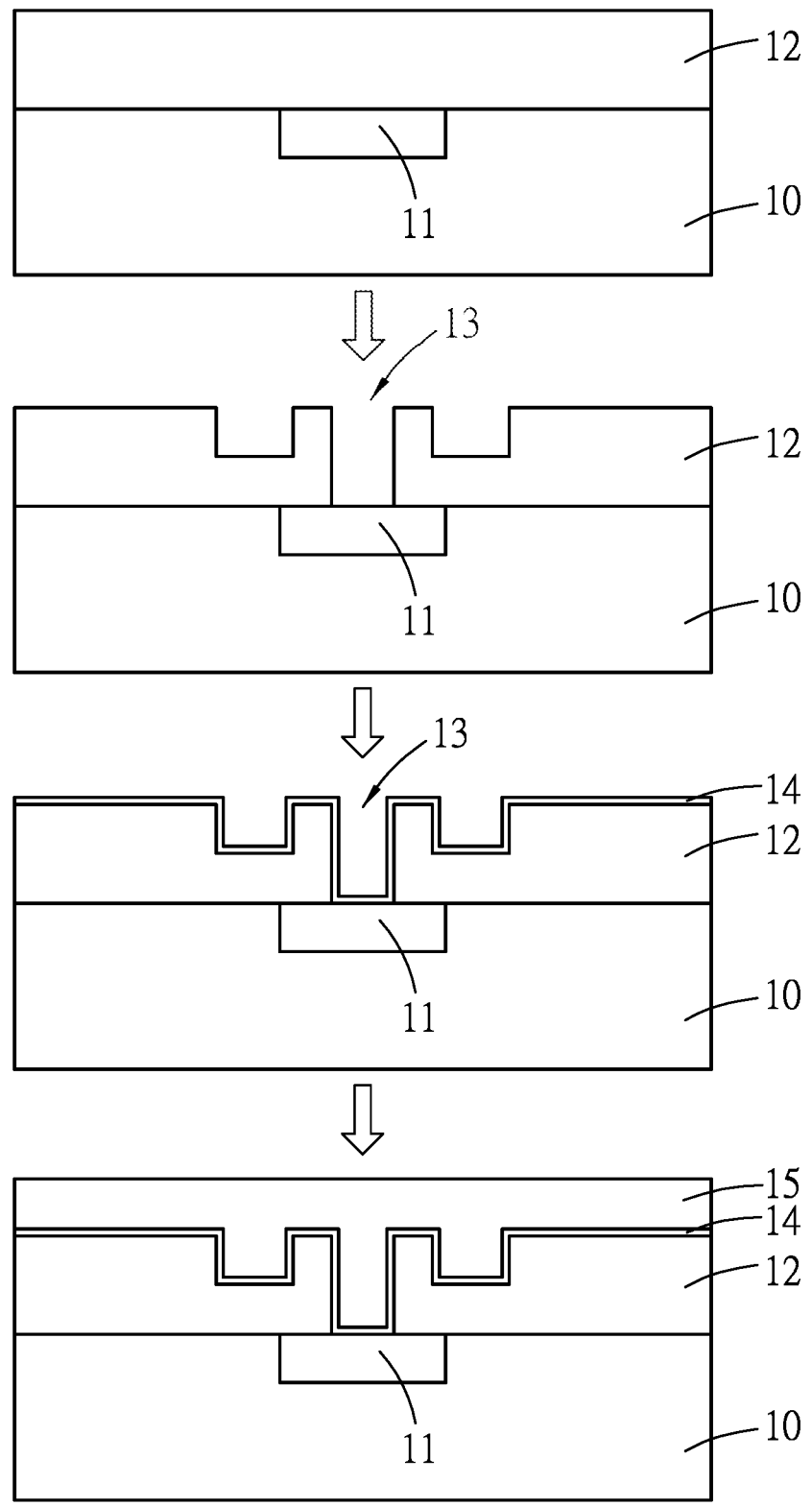
FIG. 1 illustrates schematic views of stages in the formation of a semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates schematic views of steps in the formation of a semiconductor structure. Firstly, a substrate 10 including a conductive feature 11 is provided. Afterwards, a dielectric layer 12 is formed on the substrate 10 by a suitable deposition technique, followed by patterning the dielectric layer 12 by a suitable etching technique to form a through hole 13. Then, a barrier/liner layer 14 and a conductive structure 15 are sequentially formed over the patterned dielectric layer 12 and fills the through hole 13 by suitable deposition techniques. The conductive structure 15 may be patterned to form a suitable interconnect structure.

Figure 2:
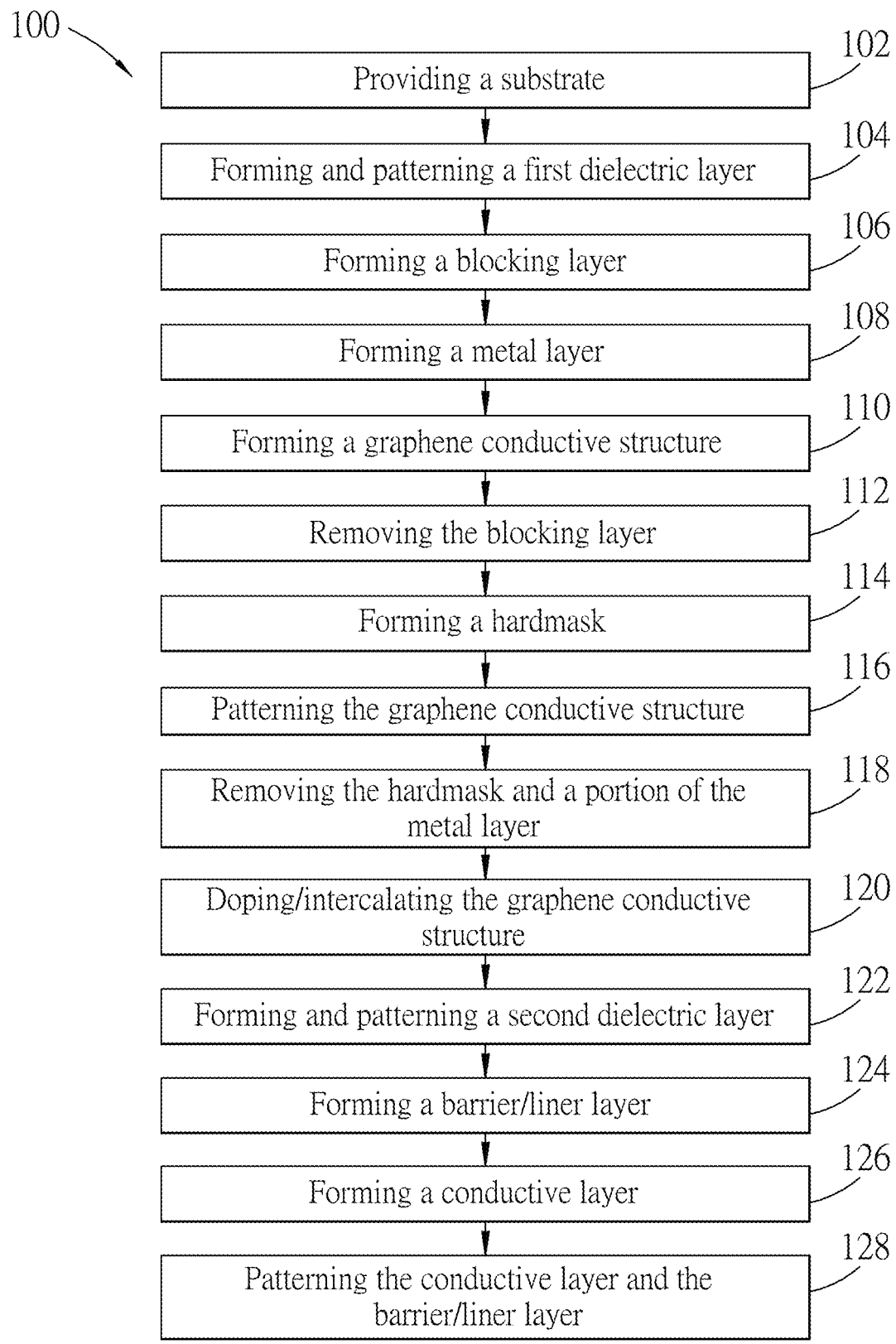
FIG. 2 illustrates a process flow for making a semiconductor structure in accordance with some embodiments.

FIGS. 3 to 13 illustrate schematic views of intermediate steps in the formation of a semiconductor structure in accordance with some embodiments. The corresponding processes are also reflected in the flow chart 100 as shown in FIG. 2.

Figure 3:
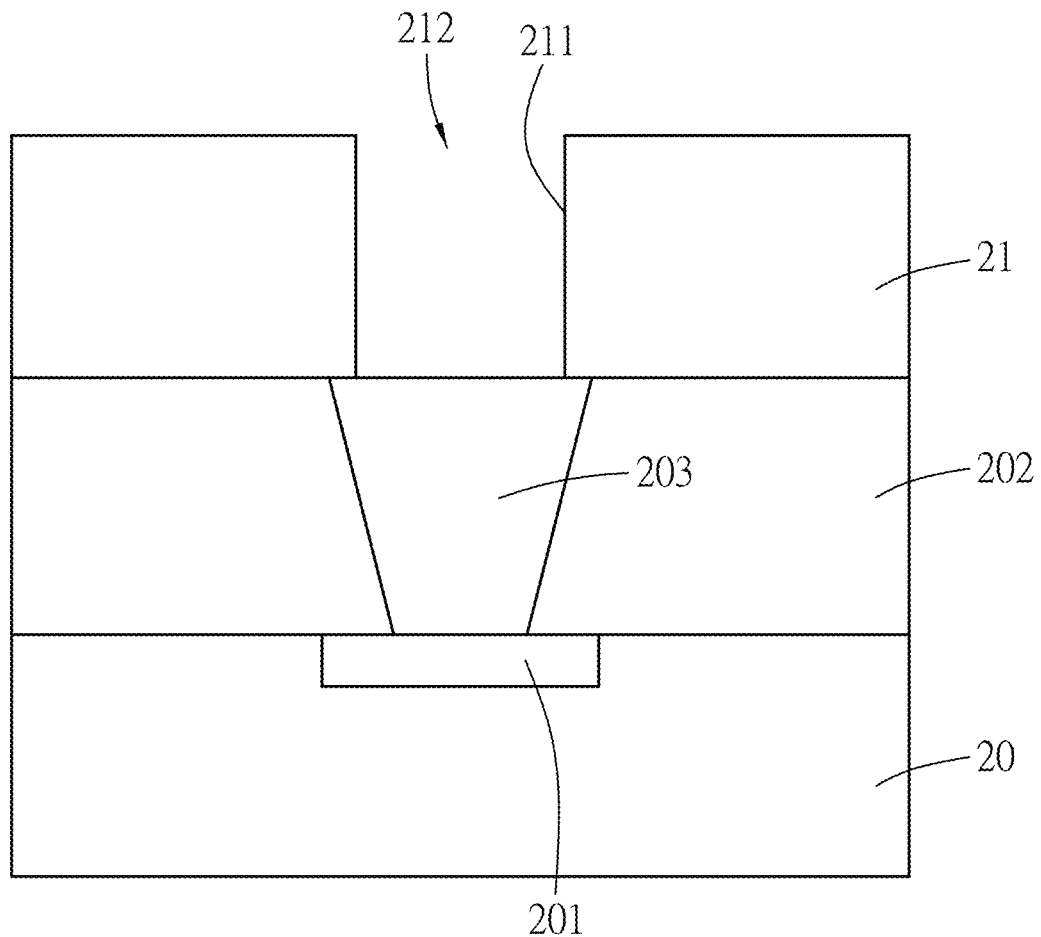
FIGS. 3 through 13 illustrate schematic views of stages in the formation of a semiconductor structure in accordance with some embodiments.

As shown in FIG. 3, in accordance with some embodiments, a substrate 20 is provided. This process is illustrated as process 102 in the flow chart 100 shown in FIG. 2. In some embodiments, the substrate 20 may be a semiconductor substrate, e.g., an elemental semiconductor or a compound semiconductor. An elemental semiconductor is composed of single species of atoms, such as silicon (Si) and germanium (Ge) in column 14 of the periodic table. A compound semiconductor is composed of two or more elements, such as silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or the like. The compound semiconductor may have a gradient feature in which the composition changes from one ratio at one location to another ratio at another location in the compound semiconductor. The compound semiconductor may be formed over a silicon substrate. The compound semiconductor may be strained. In some embodiments, the substrate 20 may include a multilayer compound semiconductor structure. Alternatively, the substrate 20 may include a non-semiconductor material, such as a glass, fused quartz, or calcium fluoride. Furthermore, in some embodiments, the substrate 20 may be a semiconductor on insulator (SOI) (e.g., silicon germanium on insulator (SGOI)). Generally, an SOI substrate includes a layer of a semiconductor material such as epitaxial silicon (Si), germanium (Ge), silicon germanium (SiGe), or combinations thereof. The substrate 20 may be doped with a p-type dopant, such as boron (Br), aluminum (Al), gallium (Ga), or the like, or may alternatively be doped with an n-type dopant, as is known in the art. In some embodiments, the substrate 20 may include a doped epitaxial layer. Shallow trench isolation (STI) regions (not shown) may be formed in the substrate 20 to isolate active regions (only one is schematically shown in FIG. 3 with numeral 201), such as source or drain regions of an integrated circuit device (not shown) in the substrate 20. In some embodiments, the integrated circuit device may include transistors (e.g., field-effect transistors (FETs), complementary metal-oxide semiconductor (CMOS) transistors, planar or vertical multi-gate transistors (e.g., FinFET devices), gate-all-around (GAA) devices, or the like), resistors, capacitors, diodes, interconnections, or the like, based on practical applications. In addition, through-vias (not shown) may be formed to extend into the substrate 20 for electrically connecting features on opposite sides of the substrate 20.

In accordance with some embodiments, a dielectric layer 202 is formed over the substrate 20, and a contact feature 203 is formed in the dielectric layer 202 and is electrically connected to the active region 201.

In accordance with some embodiments, subsequent to the provision of the substrate 20, a first dielectric layer 21 is formed over the dielectric layer 202 and is patterned to form an interconnect opening 212 exposing the contact feature 203. This process is illustrated as process 104 in the flow chart 100 shown in FIG. 2. In some embodiments, the first dielectric layer 21 has an inner lateral surface 211 that defines the interconnect opening 212. In some embodiments, the inner lateral surface 211 of the first dielectric layer 21 is perpendicular to the substrate 20. In some embodiments, the first dielectric layer 21 includes undoped silicate glass (USG), phosphosilicate glass (PSG), borosilicate glass (BSG), boron-doped phosphosilicate glass (BPSG), fluorine-doped silicate glass (FSG), silicon dioxide ($SiO_2$), SiOC-based materials (e.g., SiOCH), or the like. In some embodiments, silicon dioxide may be formed from tetraethyl orthosilicate (TEOS). In some embodiments, the first dielectric layer 21 may be formed to be porous to lower the dielectric constant thereof. The first dielectric layer 21 may be formed using a suitable technique, such as spin-on coating, flowable chemical vapor deposition (FCVD), plasma enhanced CVD (PECVD), low pressure chemical vapor deposition (LPCVD), atomic layer deposition (ALD), or the like. In some embodiments, the first dielectric layer 21 may include an anti-reflective layer (not shown), such as a nitrogen-free anti-reflective coating (NFARC), for preventing radiation used in a subsequent photolithographic process from reflecting off layers below and interfering with the exposure procedure. The NFARC may include a material such as silicon-rich oxide (SRO), or silicon oxygen carbide (i.e., carbon-doped silicon oxide). The NFARC may be formed by CVD or the like.

In accordance with some embodiments, a photoresist (not shown) may be used for patterning the first dielectric layer 21. The photoresist is first formed on the first dielectric layer 21, and is then patterned using a patterned mask. The photoresist may include a photosensitive material which undergoes a property change when exposed to light. The property change may be used to selectively remove exposed or unexposed portions of the photoresist in a photolithographic patterning process. In some embodiments, a photolithographic system exposes the photoresist to radiation. Radiation light passing through the patterned mask strikes the photoresist to thereby transfer a layout of the patterned mask to the photoresist. In some embodiments, the photoresist may be patterned using a direct writing or maskless lithographic technique, such as laser patterning, e-beam patterning, ion-beam patterning, or the like. After the exposure step, the photoresist is then developed, leaving the exposed portions of the photoresist, or in alternative examples, leaving the unexposed portions of the photoresist. In some embodiments, the patterning process may include multiple steps, such as soft baking of the photoresist, mask alignment, exposure, post-exposure baking, developing of the photoresist, rinsing, and drying (e.g., hard baking). Each of the steps may be repeated or omitted according to practical requirements. The patterned photoresist exposes portions of the first dielectric layer 21 to be etched. In some embodiments, the etching process may include an anisotropic (i.e., directional) etching configured to etch vertically through the first dielectric layer 21 without substantial horizontal etching. Accordingly, the etching process may include any suitable etching technique, such as dry etching, wet etching, reactive ion etching (RIE), ashing, or the like. The etching process may use any suitable etchant, and the particular etchant or etchants may depend on the materials of the first dielectric layer 21 being used.

Figure 4:
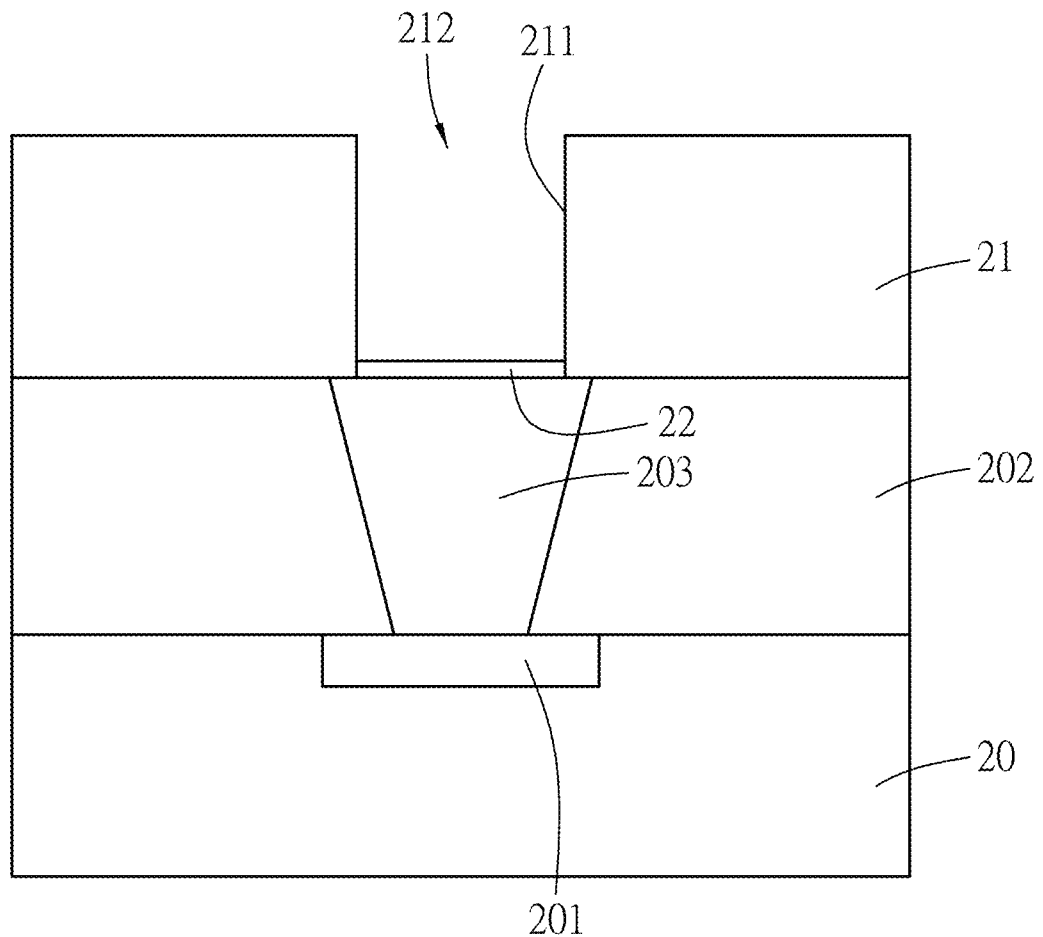

FIG. 4 illustrates that, after the first dielectric layer 21 is patterned to form the interconnect opening 212, a blocking layer 22 is selectively formed in the interconnect opening 212 to cover the contact feature 203, and is not formed on the first dielectric layer 21. This process is illustrated as process 106 in the flow chart 100 shown in FIG. 2. In some embodiments, the blocking layer 22 may be formed from a self-assembling monolayer (SAM) material 22' including a head group 221 and a tail group 222 (see FIG. 14). In some embodiments, the head group 221 contains phosphorus (P), sulfur (S), and/or nitrogen (N). In some embodiments, the head group 221 may include a phosphonic acid-containing material, which can be selectively formed on the contact feature 203 under a temperature ranging from about 0° C. to about room temperature (e.g., about 25° C.). In some embodiments, the head group 221 may include octadecylphosphonic acid (ODPA), n-octyl phosphonic acid, diphenylphosphine, 1,4-Bis(diphenylphosphino)butane, decylphosphonic acid (DPA), tetradecylphosphonic acid (TPA), combinations thereof, or the like. In some embodiments, the head group 221 may include a thiol-containing material. In some embodiments, the head group 221 may include alkanethiol, e.g., 1-hexanethiol, 1-heptanethiol, thiophenol, 1-octanethiol, dodecanethiol, propanethiol, butanethiol, nonanethio, combinations thereof, or the like. In some embodiments, the head group 221 may include an alkanolamine-containing material. In some embodiments, the head group 221 may include propylamine, isobutylamine, pentylamine, octylamine, hexylamine, combinations thereof, or the like. The head group 221 allows the SAM material 22' to be selectively bonded to the contact feature 203, and not bonded to the first dielectric layer 21, thereby selectively forming the blocking layer 22 covering the contact feature 203. In some embodiments, the tail group 222 may contains an organic chain, such as CHx (e.g., an alkyl chain), CFx, or the like. In some embodiments, the blocking layer 22 may be formed by a suitable technique, such as ALD (including plasma-enhanced ALD (PEALD)), molecular layer deposition (MLD), CVD (including FCVD, PECVD, LPCVD), spin-on coating, dipping, or the like.

Figure 5:
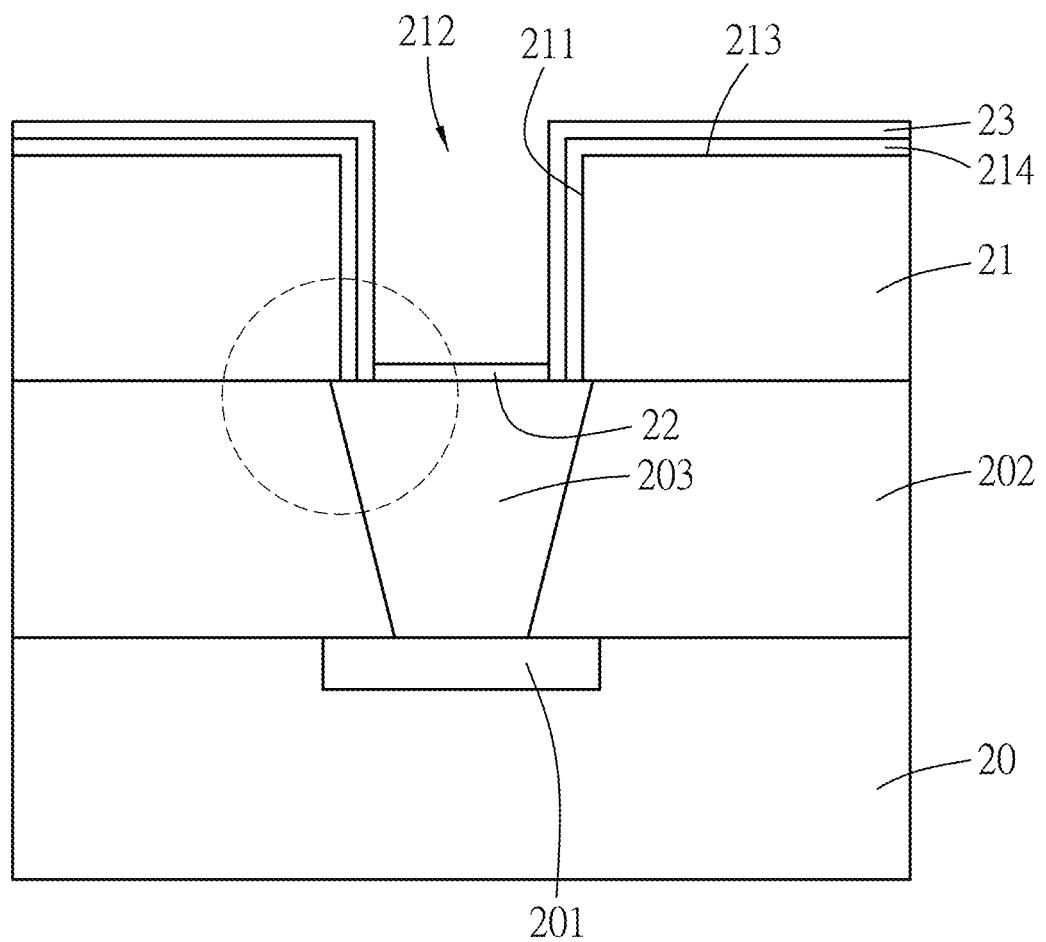
Figure 14:
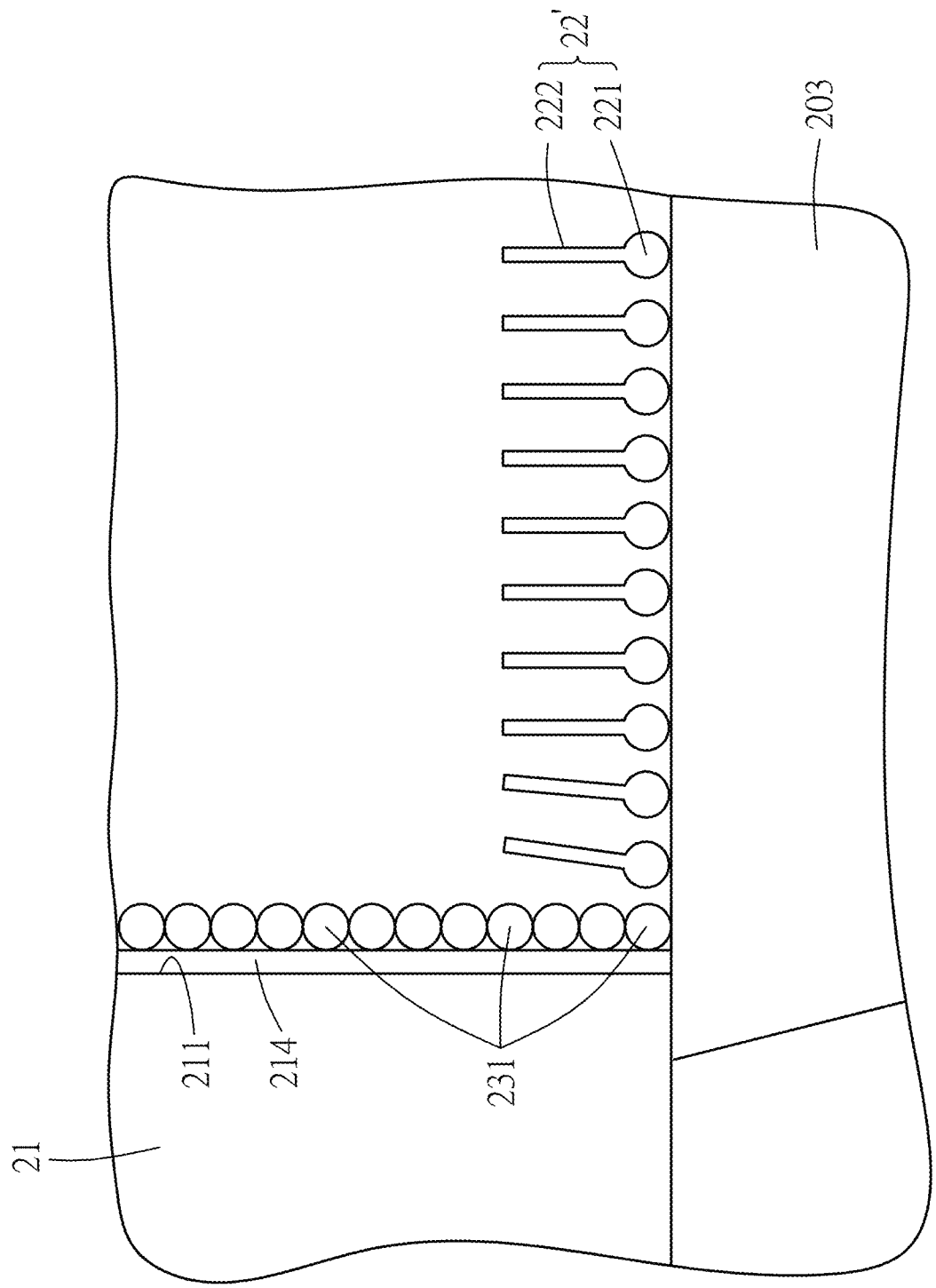
FIG. 14 is a schematic enlarged view taken from the dotted circle of FIG. 5.

FIG. 5 illustrates that, after the formation of the blocking layer 22, a metal layer 23 is selectively formed on the inner lateral surface 211 of the first dielectric layer 21 and an upper surface 213 of the first dielectric layer 21, and is not formed on the blocking layer 22. This process is illustrated as process 108 in the flow chart 100 shown in FIG. 2. FIG. 14 is a schematic enlarged view taken from the dotted circle of FIG. 5. In some embodiments, the tail group 222 of the SAM material 22' may be hydrophobically-terminated to repulse a precursor of the metal layer 23 deposition. In some embodiments, the SAM material 22' close to the first dielectric layer 21 may be slightly repulsed away from the first dielectric layer 21, allowing molecules 231 of the metal layer 23 entering a space between the inner lateral surface 211 of the first dielectric layer 21 and the immediate adjacent SAM material 22', allowing the metal layer 23 to substantially cover the entirety of the inner lateral surface 211. In some embodiments, the metal layer 23 may be formed by suitable techniques, such as physical vapor deposition (PVD), CVD, ALD, electroless deposition (ELD), or the like. In some embodiments, the metal layer 23 may include Co, Ni, Ru, Rh, Pd, Re, Cu, Ag, Ir, Pt, Au, Ti, Hf, Ta, W, Mo, Fe, or combinations thereof. In some embodiments, the metal layer 23 may react with the first dielectric layer 21 to form a metal silicate layer 214. In some embodiments, the metal silicate layer 214 may be electrically insulating, and may serve as a barrier layer.

Figure 6:
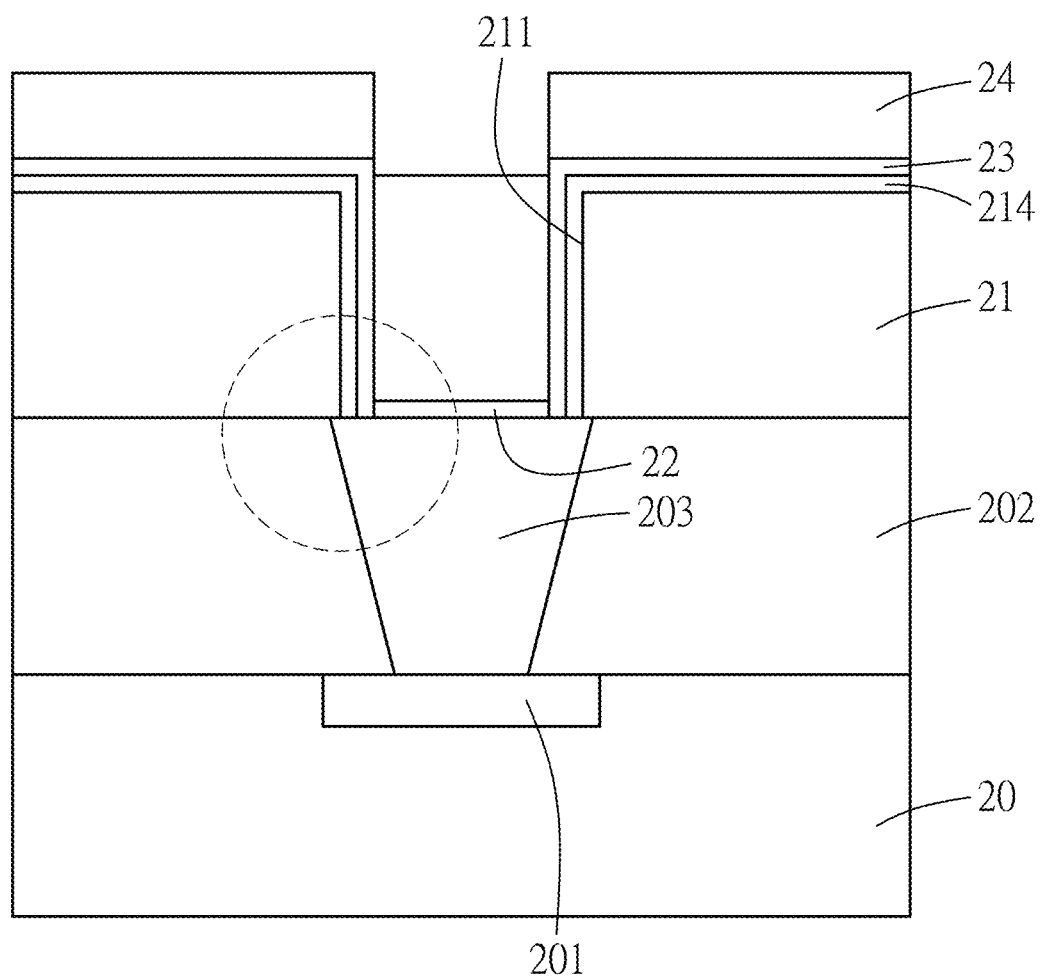

FIG. 6 illustrates that, after the formation of the metal layer 23, a graphene conductive structure 24 is formed on the metal layer 23 and fills the interconnect opening 212 (see FIG. 5). This process is illustrated as process 110 in the flow chart 100 shown in FIG. 2. In accordance with some embodiments, the graphene conductive structure 24 may be deposited using PECVD with one of radio frequency (RF) plasma, direct current (DC) plasma, inductively coupled plasma (ICIP), microwave (MW) plasma, electron cyclotron resonance (ECR) plasma, or the like. In alternative embodiments, the graphene conductive structure 24 may be deposited using thermal CVD. In some embodiments, temperature of the deposition process may range from room temperature to about 10000° C. In some embodiments, the graphene deposition process is PECVD to allow the deposition to take place at a temperature below about 400° C., thereby minimizing the influence of high temperature on IC devices (not shown) in the substrate 20. In some embodiments, precursors for depositing the graphene conductive structure 24 may include CO, $CH_4$, $C_2H_2$, $CF_4$, $C_2F_6$, $CHF_3$, aromatic compound (e.g., benzene, pyridine, or the like), derivatives thereof, or the like. In some embodiments, the metal layer 23 may serve as a catalyst layer for the growth of the graphene conductive structure 24.

Figure 15:
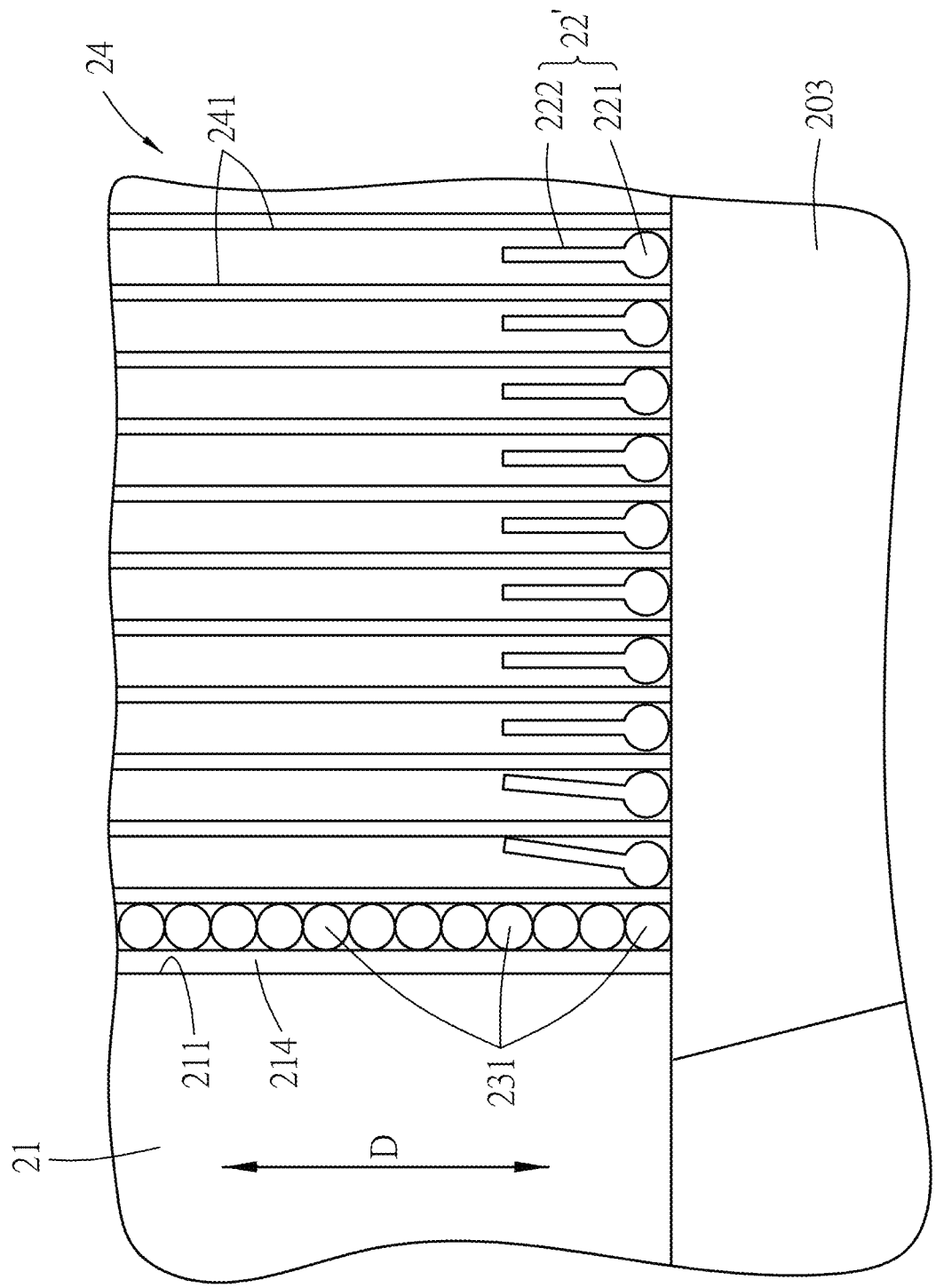
FIG. 15 is a schematic enlarged view taken from the dotted circle of FIG. 6.
Figure 17:
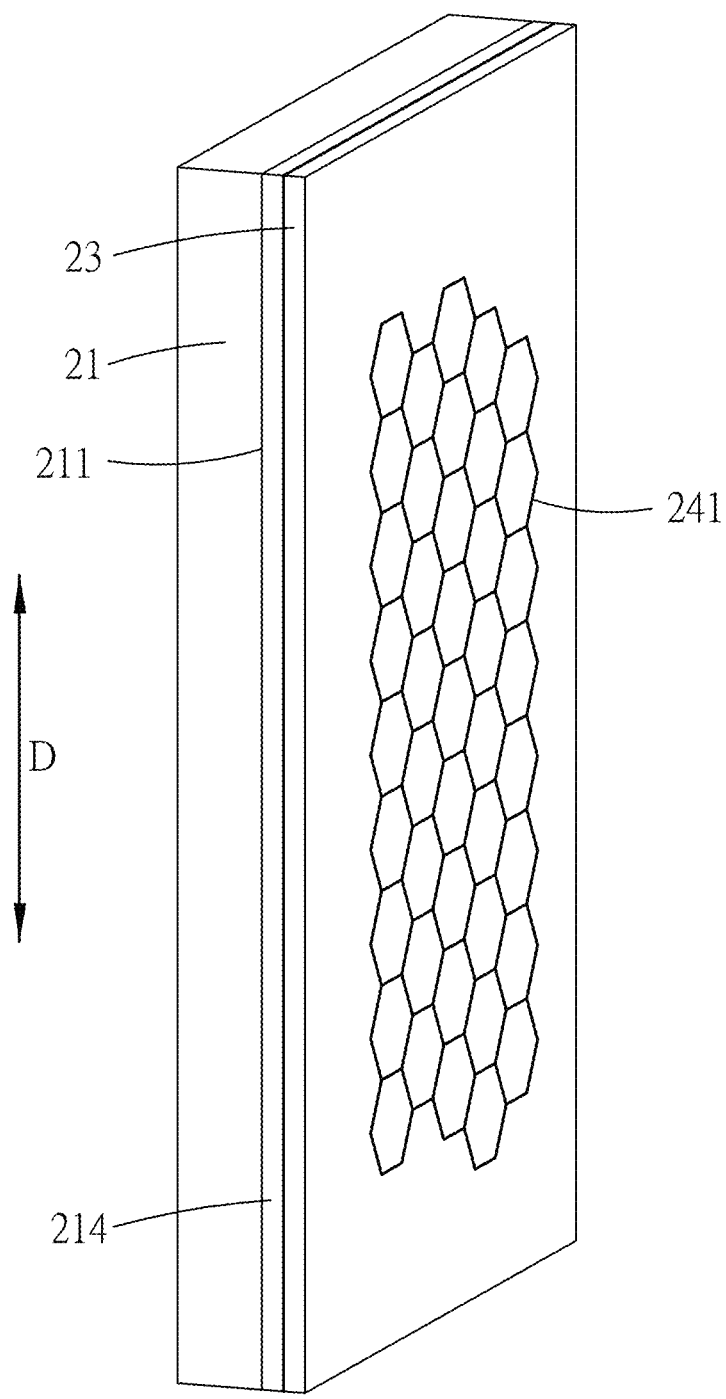
FIG. 17 is a schematic view showing a graphene layer of the semiconductor structure in accordance with some embodiments.

FIG. 15 is a schematic enlarged view taken from the dotted circle of FIG. 6. In some embodiments, the graphene conductive structure 24 in the interconnect opening 212. (see FIG. 5) includes a plurality of graphene layers 241 that are formed on the metal layer 23 in a laver-by-layer manner until the graphene conductive structure 24 completely fills the interconnect opening 212. Each of the graphene layers 241 extends in a direction (D) (e.g., a vertical direction in some embodiments) parallel to the inner lateral surface 211 of the first dielectric layer 21. Referring further to FIG. 17, in accordance with some embodiments, each of the graphene layers 241 may be composed of a plurality of carbon atoms arranged in a honeycomb pattern (i.e., hexagons) extending in the direction (D) and parallel to the inner lateral surface 211 of the first dielectric layer 21. One graphene layer 241 is schematically illustrated in FIG. 17, in which the honeycomb carbon layer extends in the direction (D) and parallel to the inner lateral surface 211 of the first dielectric layer 21, and the graphene layer 241 may be a two-dimensional structure.

As shown in FIG. 15, in accordance with some embodiments, the graphene layers 241 of the graphene conductive structure 24 may extend into the SAM material 22' and be electrically connected to the contact feature 203.

Figure 7:
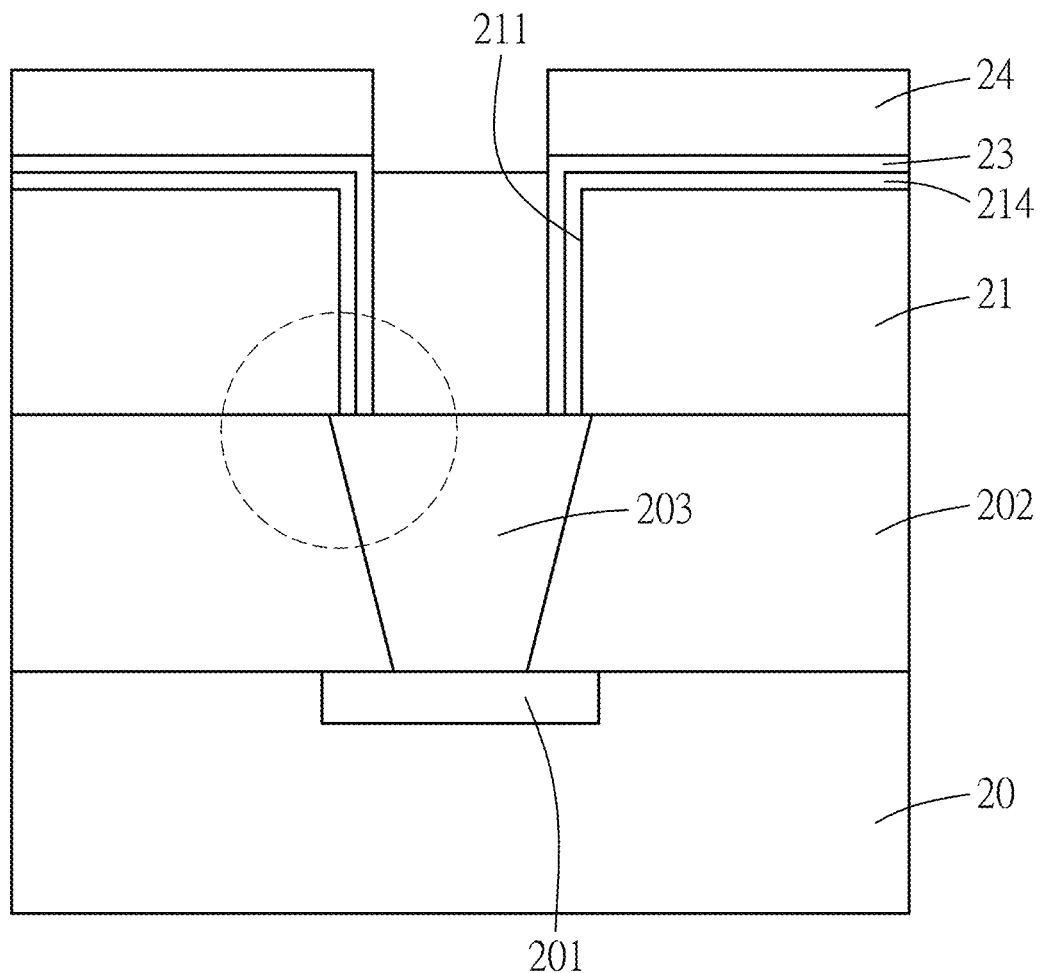
Figure 16:
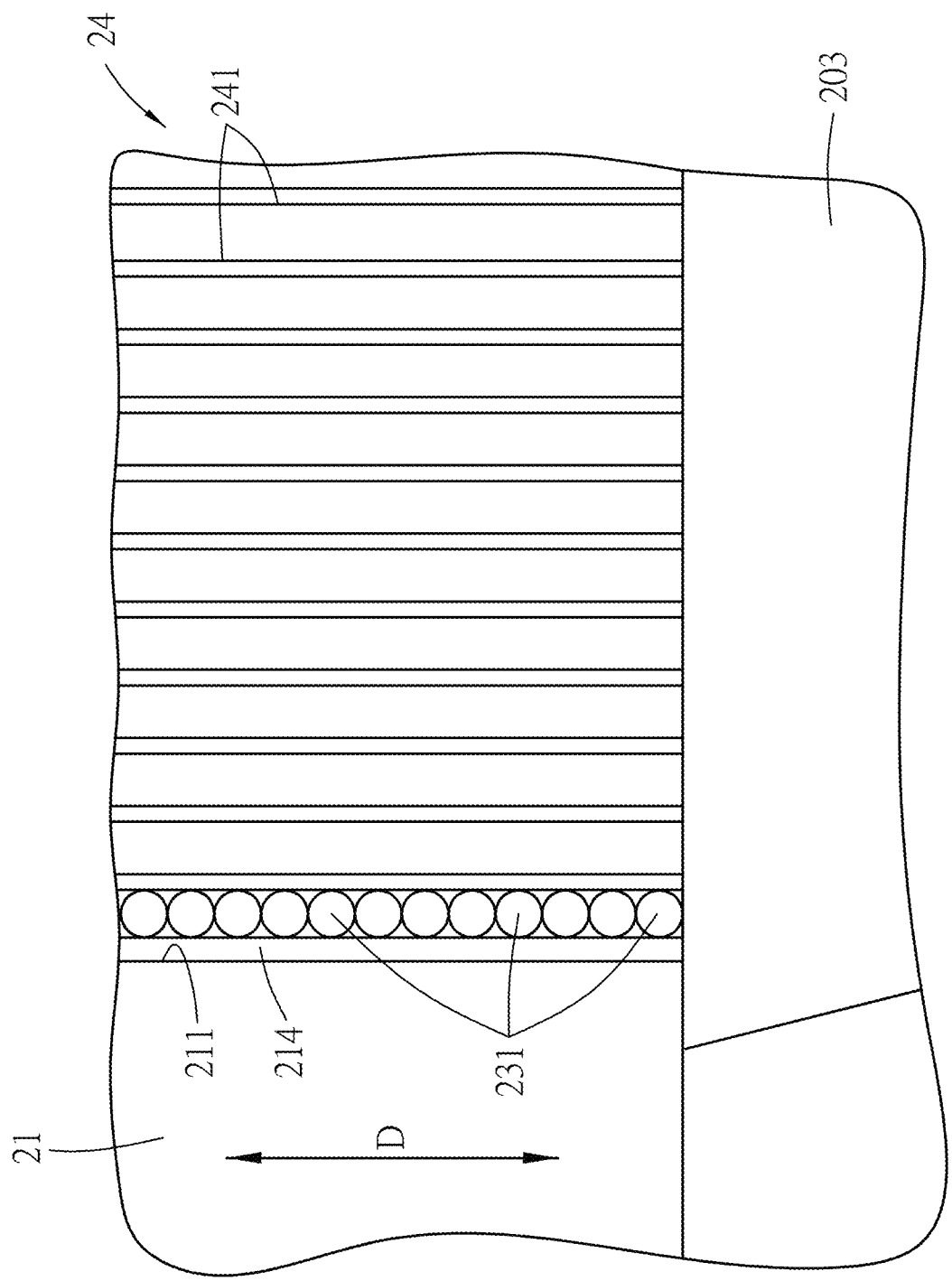
FIG. 16 is a schematic enlarged view taken from the dotted circle of FIG. 7.

FIG. 7 illustrates that, after the formation of the graphene conductive structure 24, the blocking layer 22 (see FIG. 6) is removed. A schematic enlarged view taken from the dotted circle of FIG. 7 is shown in FIG. 16. This process is illustrated as process 112 in the flow chart 100 shown in FIG. 2. In some embodiments, the blocking layer 22 may be removed by suitable plasma, such as $NH_3$-containing plasma, $H_2$-containing plasma, Ar-containing plasma, or the like. In some embodiments, the plasma power may range from about 50 W to about 1250 W, and the process pressure may range from about 0.3 Pa to about 10 Pa. Alternatively, the blocking layer 22 may be removed by heating the blocking layer 22 to a decomposition temperature thereof. In some embodiments, the blocking layer 22 may be removed after the formation of the metal layer 23 and before the formation of the graphene conductive structure 24.

Figure 8:
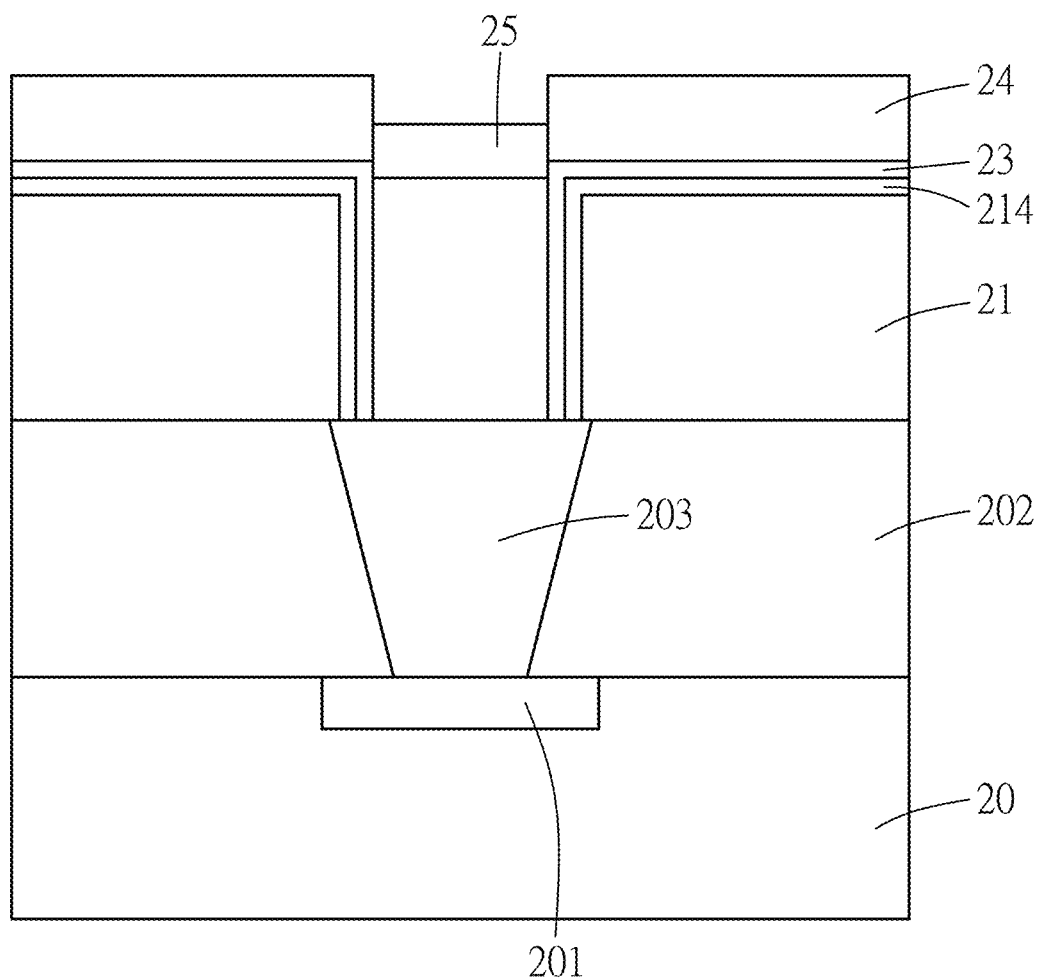

FIG. 8 illustrates that, after the removal of the blocking layer 22 (see FIG. 6), a hardmask 25 is formed to cover the grapheme conductive structure 24 in the interconnect opening 212 (see FIG. 5). The process is illustrated as process 114 in the flow chart 100 shown in FIG. 2. In some embodiments, the hardmask 25 may be made of suitable metal oxide or metal nitride, such as TiN, WC, or the like, and the hardmask 25 may be formed by suitable techniques, such as PVD, CVD, ALD, or the like.

Figure 9:
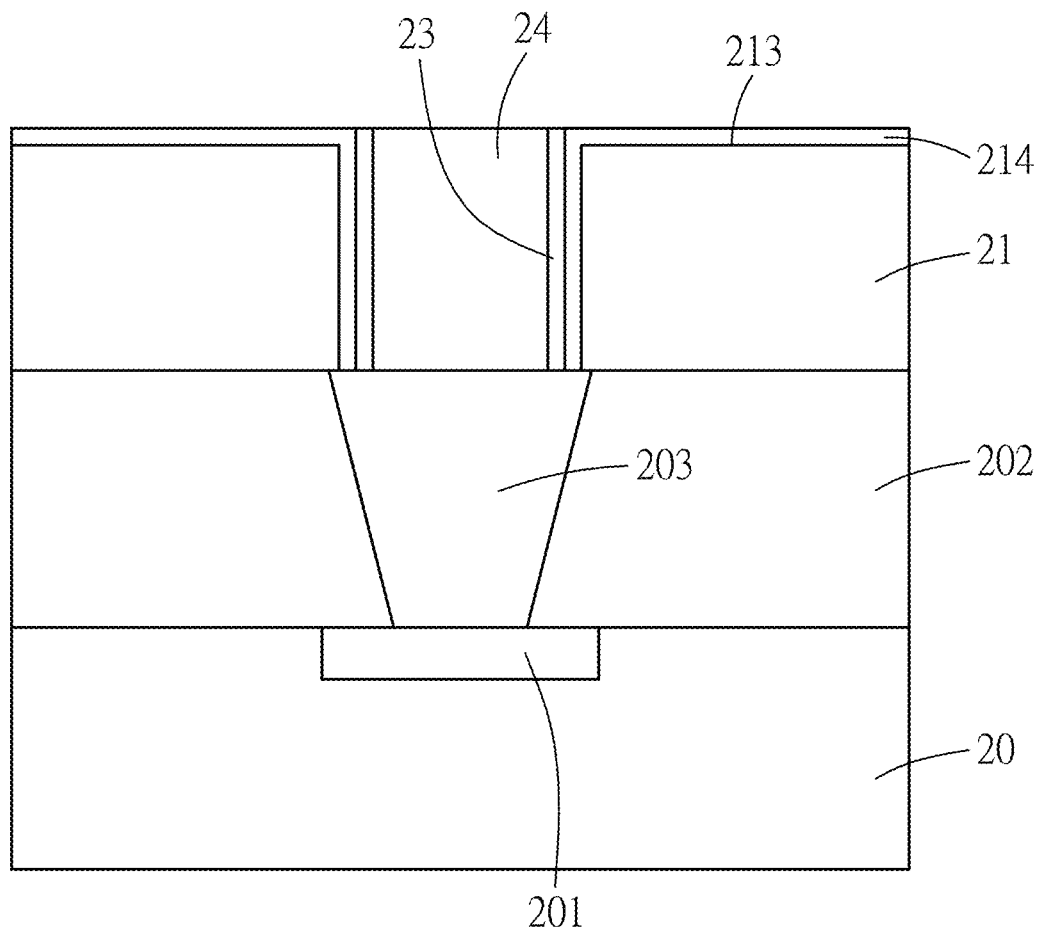

FIG. 9 illustrates that, after the formation of the hardmask 25, the graphene conductive structure 24 is patterned such that the graphene conductive structure 24 on the upper surface 213 of the first dielectric layer 21 is removed, followed by removing the metal layer 23 on the upper surface 213 and the hardmask 25 (see FIG. 8). These processes are respectively illustrated as processes 116 and 118 in the flow chart 100 shown in FIG. 2. In some embodiments, the graphene conductive structure 24 on the upper surface 213 may be removed by oxygen-containing plasma, and the metal layer 23 on the upper surface 213 may be oxidized by the oxygen-containing plasma. In some embodiments, the metal layer 23 on the upper surface 213 and the hardmask 25 may be removed by wet process using suitable chemicals, such as oxidant (e.g., $H_2O_2$ solution), or the like.

Figure 18:
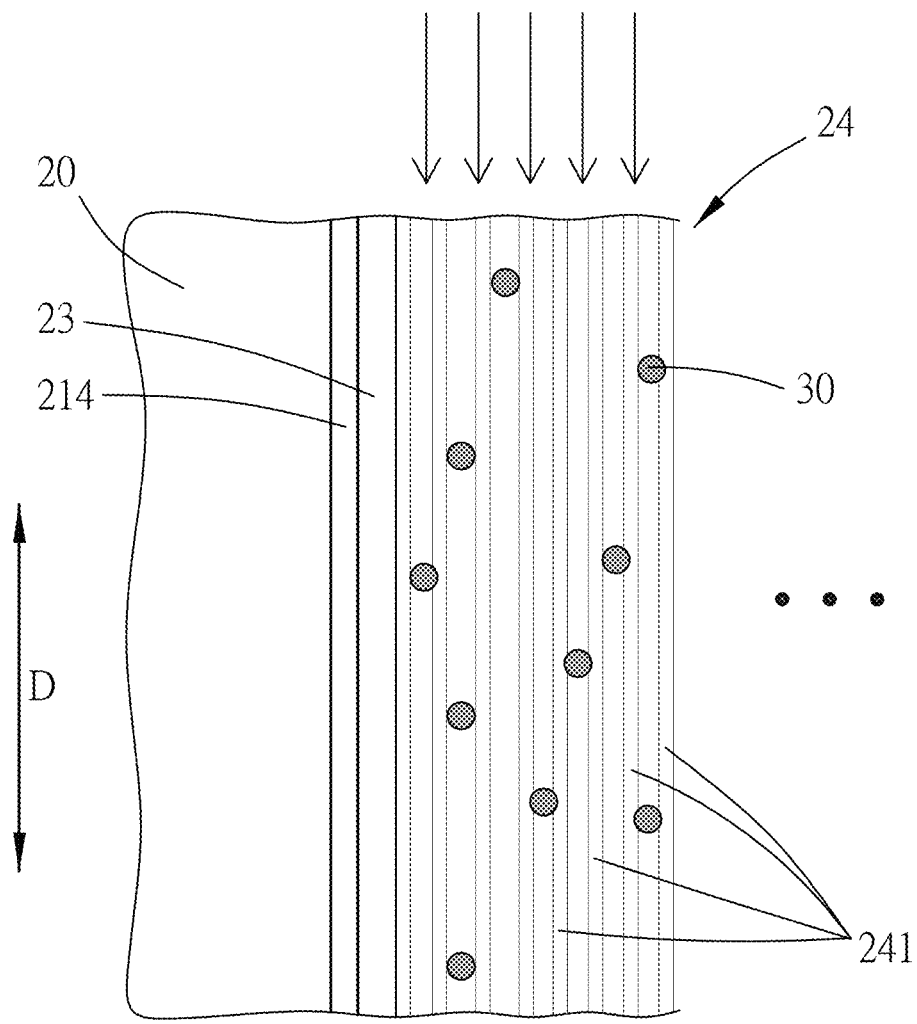
FIG. 18 is a schematic view illustrating doping/intercalation of a semiconductor structure in accordance with some embodiments.

FIG. 18 illustrates that, after the removal of the metal layer 23 on the upper surface 213 of the first dielectric layer 21 and the hardmask 25, an intercalating material 30 may be doped or intercalated into the graphene conductive structure 24, such that the electrical conductivity of the graphene conductive structure 24 may be enhanced. This process is illustrated as process 120 in the flow chart 100 shown in FIG. 2. The doping or intercalation process may include vapor phase diffusion, CVD, PECVD, liquid phase immersion, implantation, or the like. Some examples of the intercalating material 30 may include Tetraethylenepentamine (TEPA), Diethylenetriamine (DETA), o-Phenylenediamine (OPD), 1,2,4-Triazole, Tetraethylene glycol (TEG), Phenol, Catechol, Trifluorobenzene, Hexafluorobenzene (HFB), or the like. Alternatively, the intercalating material 30 may be, but not limited to, $FeCl_3$, $MoCl_5$, $AuCl_3$, $AlCl_3$, $AsF_5$, $SbF_5$, $HNO_3$, $CuCl_2$, $SbCl_5$, $AuCl_5$, $NiCl_2$, $Cs-C_2H_4$, $NH_3$, ZnMg, $Br_2$, $Cl_2$, $H_2SO_4$, their derivatives, or the like. In some embodiments, the intercalating material 30 may include metal, such as Li, K, Cs, Na, or the like, or their ions. In some embodiments, the intercalating material 30 may include polymer or oligomer, such as polymethyl methacrylate (PMMA), polystyrene (PS), polycaprolactam (PA6), or the like. In some embodiments, the doping/intercalating process is conducted at a temperature below about 400° C. In some embodiments, the doping/intercalating direction of the intercalating material 30 is substantially parallel to the extending direction (D) of the graphene layers 241 of the graphene conductive structure 24, thereby allowing the intercalating material 30 to be effectively doped or intercalated into the graphene conductive structure 24.

Figure 10:
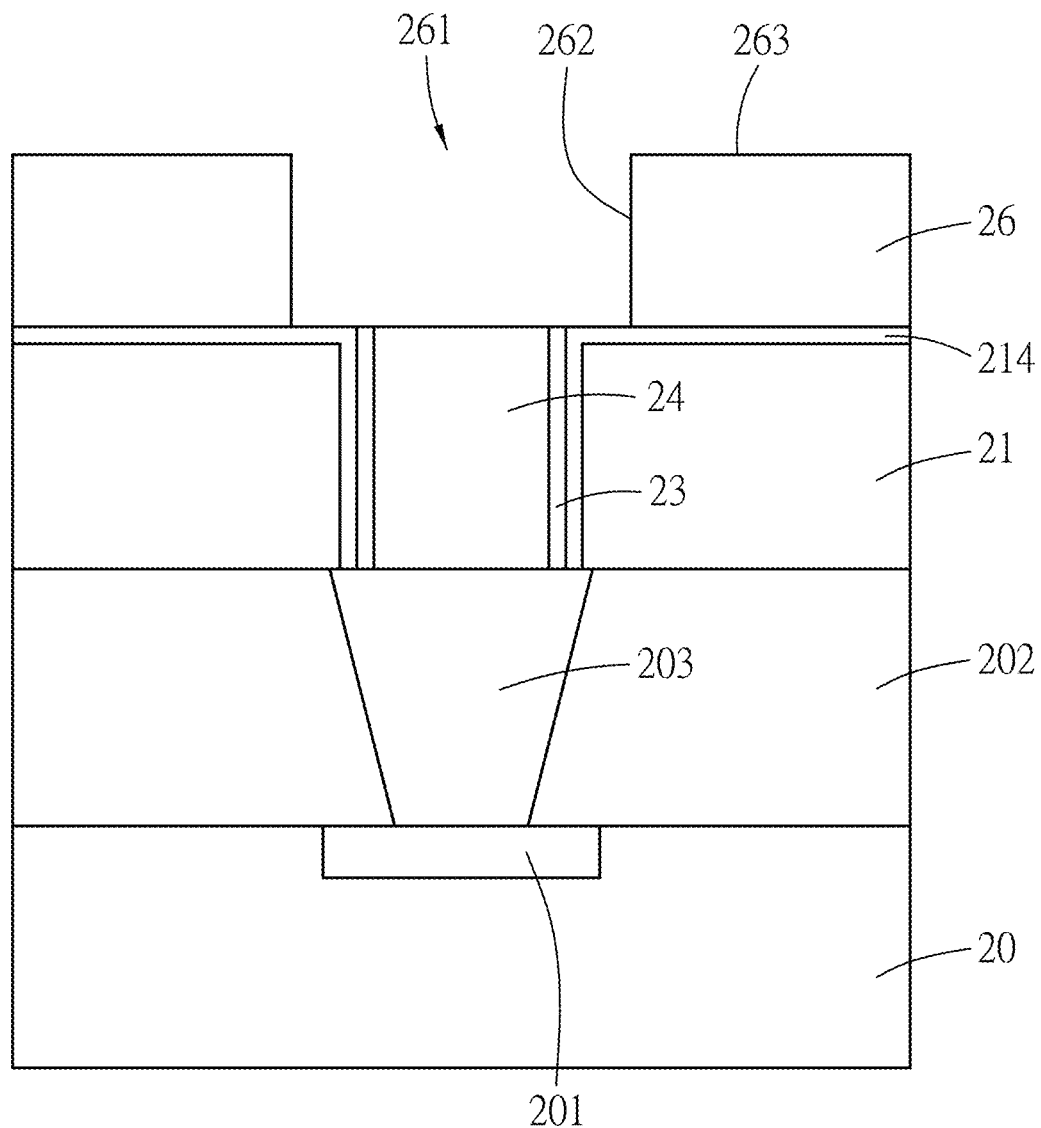

FIG. 10 illustrates that, after the doping/intercalation process, a second dielectric layer 26 is formed on the first dielectric layer 21, followed by patterning the second dielectric layer 26 to form a through hole 261 that exposes the graphene conductive structure 24. This process is illustrated as processes 122 in the flow chart 100 shown in FIG. 2. In some embodiments, the second dielectric layer 26 includes USG, PSG, BSG, BPSG, FSG, $SiO_2$, SiOC-based materials (e.g., SiOCH), or the like. In some embodiments, $SiO_2$ may be made of TEOS. In some embodiments, the second dielectric layer 26 may be formed to be porous to lower the dielectric constant thereof. The second dielectric layer 26 may be formed using a suitable technique, such as spin-on coating, FCVD, PECVD, LPCVD, ALD, or the like. In some embodiments, the second dielectric layer 26 may be patterned to form the through hole 261 by any suitable etching technique, such as dry etching, wet etching, reactive ion etching (RIE), ashing, or the like. The etching process may use any suitable etchant, and the particular etchant or etchants may depend on the materials of the second dielectric layer 26 being used. In some embodiments, the second dielectric layer 26 has a lateral inner surface 262 that defines the through hole 261, and an upper surface 263 that surrounds and is connected to the lateral inner surface 262.

Figure 11:
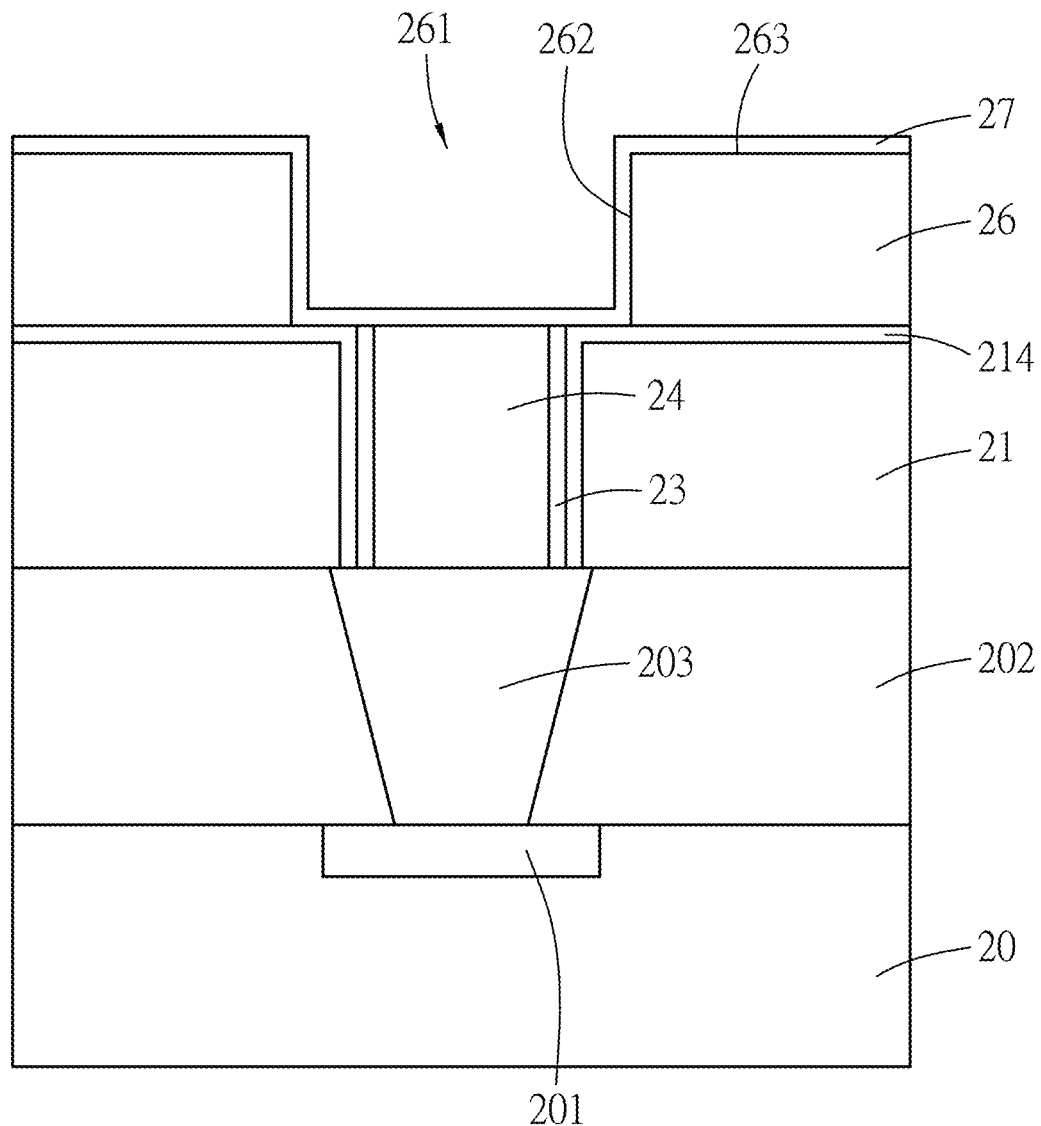

FIG. 11 illustrates that, after the formation and patterning of the second dielectric layer 26, a barrier/liner layer 27 may be formed over the second dielectric layer 26. This process is illustrated as process 124 in the flow chart 100 as shown in FIG. 2. In some embodiments, the barrier/liner layer 27 covers the upper surface 263 and the lateral inner surface 262 of the second dielectric layer 26. In some embodiments, the barrier/liner layer 27 includes a barrier and a liner. In some embodiments, the barrier of the barrier/liner layer 27 includes TaN, TiN, Ru, MnN, ZnO, MoN, or the like. In some embodiments, the liner of the barrier/liner layer 27 includes Ta, Ti, Co, Ru, or the like. In some embodiments, the barrier of the barrier/liner layer 27 may serve to prevent metal diffusion and exudation of the metal structure formed in later steps. In some embodiments, the liner of the barrier/liner layer 27 may serve to enhance adhesion of the metal structure formed in later steps to the barrier of the barrier/liner layer 27. In some embodiment, one of the liner and the barrier may be dispensed with. In some embodiments, the barrier/liner layer 27 may be dispensed with.

Figure 12:
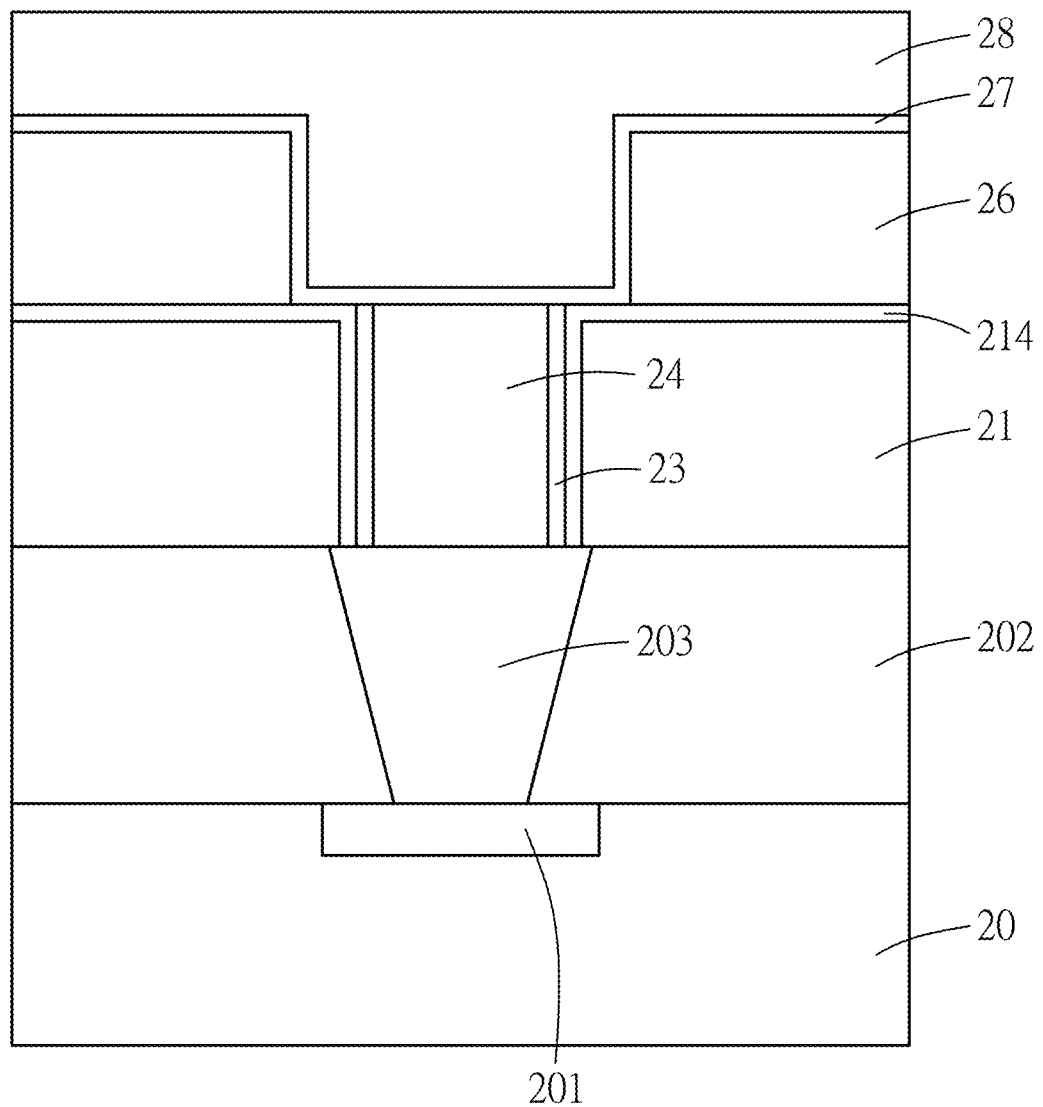

FIG. 12 illustrates that, after the formation of the barrier/liner layer 27, a conductive layer 28 is formed over the barrier/liner layer 27 to fill the through hole 261 (see FIG. 11). This process is illustrated as process 126 in the flow chart 100 as shown in FIG. 2. In some embodiments, the conductive layer 28 may be made of Cu, Co, W, Ru, Mo, Al, or the like, and may be formed by PVD, reflow PVD, CVD, ALD, ELD, a combination of PVD and electrochemical plating (ECP), or the like. In some embodiments in which the barrier/liner layer 27 is omitted, the conductive layer 28 is directly formed over the second dielectric layer 26 to fill the through hole 261.

Figure 13:
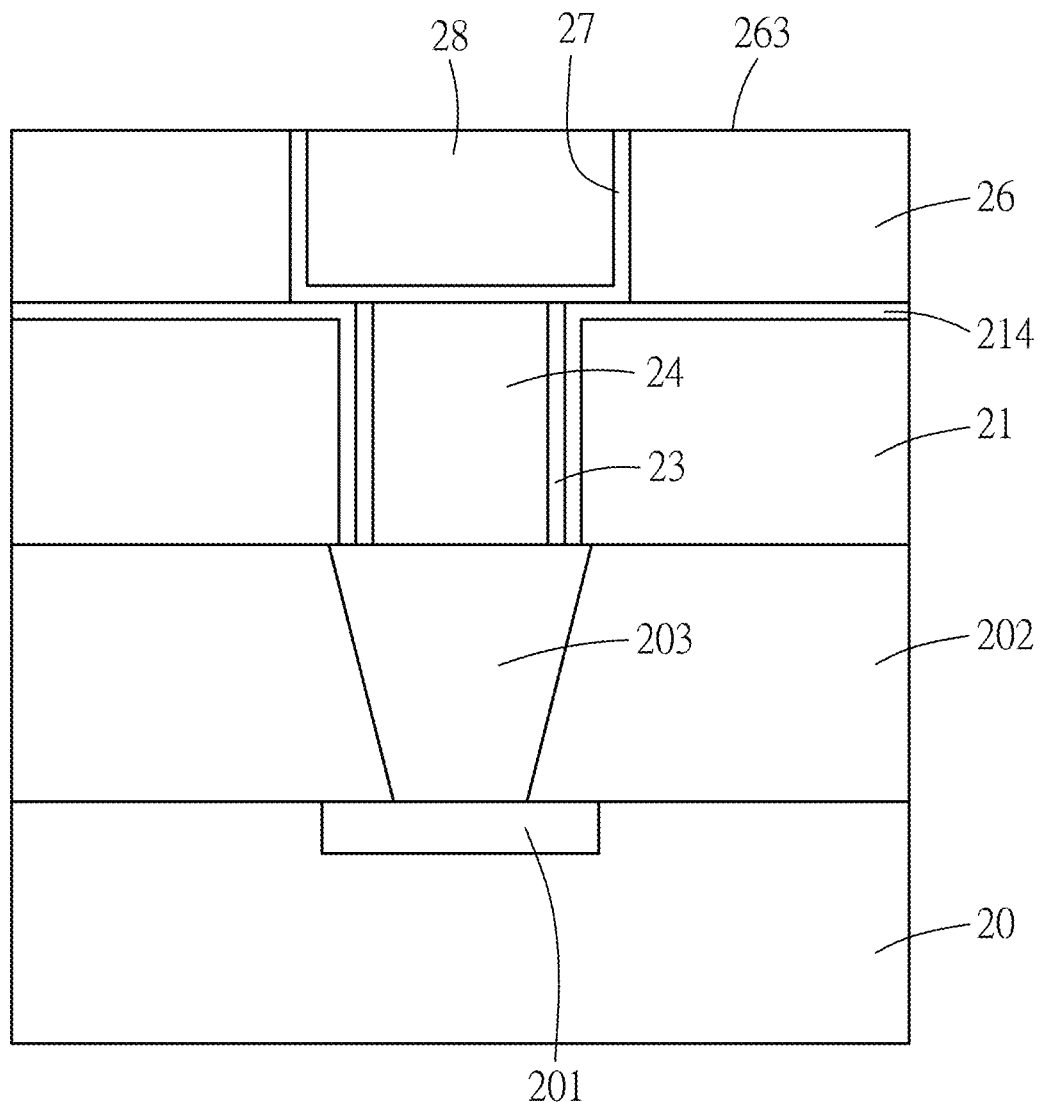

FIG. 13 illustrates that, after the formation of the conductive layer 28, the conductive layer 28 is patterned such that a portion of the conductive layer 28 in excess is removed. This process is illustrated as process 128 in the flow chart 100 as shown in FIG. 2. In some embodiments, a planarization process (e.g., chemical mechanical polish (CMP)) is adopted to remove the excess portion of the conductive layer 28 and the barrier/liner layer 27 on the upper surface 263 of the second dielectric layer 26. The patterned conductive layer 28 is electrically connected to the graphene conductive structure 24.

Figure 19:
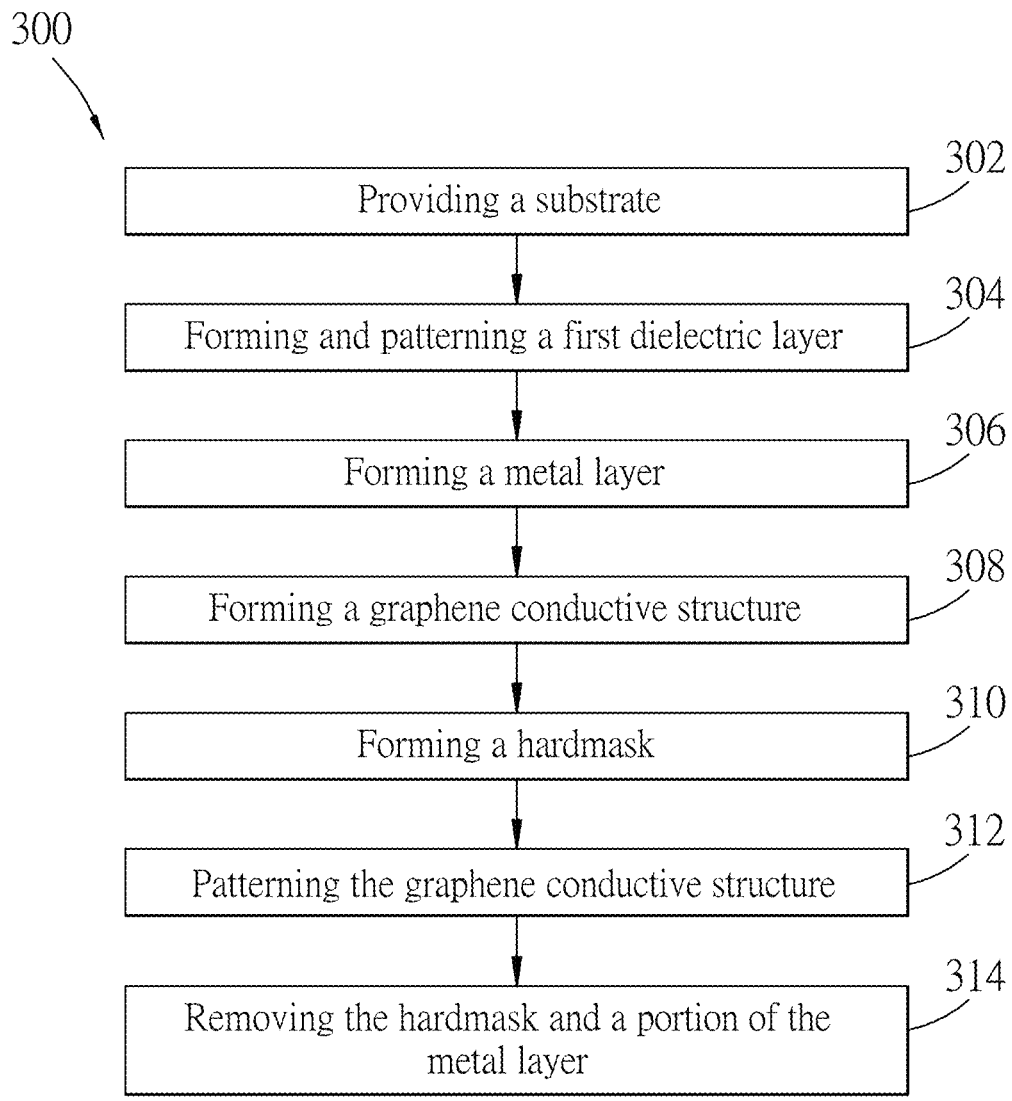
FIG. 19 illustrates a process flow for making a semiconductor structure in accordance with some embodiments.

FIGS. 20 to 24 illustrate schematic views of intermediate steps in the formation of a semiconductor structure in accordance with some embodiments. The corresponding processes are also reflected in the flow chart 300 as shown in FIG. 19.

Figure 20:
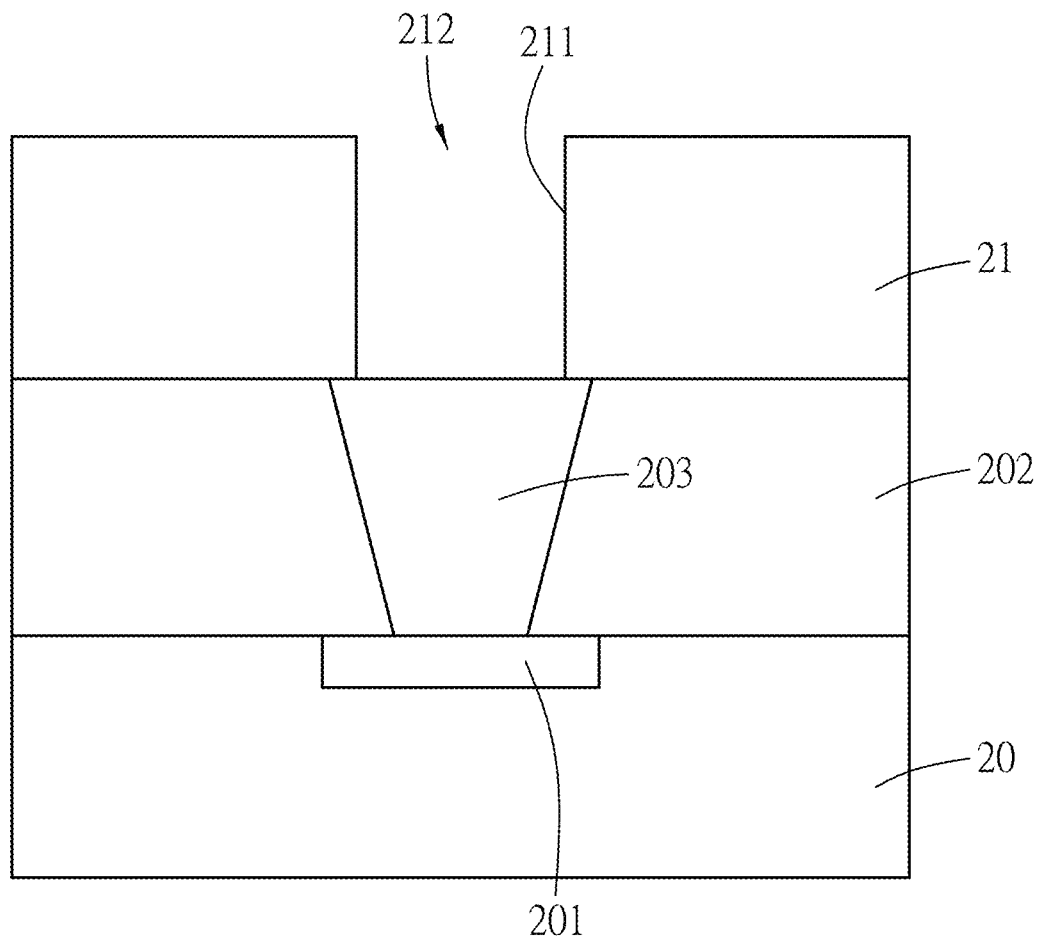
FIGS. 20 through 24 illustrate schematic views of stages in the formation of a semiconductor structure in accordance with some embodiments.

As shown in FIG. 20, in accordance with some embodiments, a substrate 20 is provided. This process is illustrated as process 302 in the flow chart 300 shown in 19. In some embodiments, the substrate 20 may be a semiconductor substrate, e.g., an elemental semiconductor or a compound semiconductor. An elemental semiconductor is composed of single species of atoms, such as silicon (Si) and germanium (Ge) in column IV of the periodic table. A compound semiconductor is composed of two or more elements, such as silicon carbide (SiC), gallium arsenide (GaAs), gallium phosphide (GaP), indium phosphide (InP), indium arsenide (InAs), indium antimonide (InSb), silicon germanium (Site), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or the like. The compound semiconductor may have a gradient feature in which the composition changes from one ratio at one location to another ratio at another location in the compound semiconductor. The compound semiconductor may be formed over a silicon substrate. The compound semiconductor may be strained. In some embodiments, the substrate 20 may include a multilayer compound semiconductor structure. Alternatively, the substrate 20 may include a non-semiconductor material, such as a glass, fused quartz, or calcium fluoride. Furthermore, in some embodiments, the substrate 20 may be a semiconductor on insulator (SOI) (e.g., silicon germanium on insulator (SGOI)). Generally, an SOI substrate includes a layer of a semiconductor material such as epitaxial silicon (Si), germanium (Ge), silicon germanium (SiGe), or combinations thereof. The substrate 20 may be doped with a p-type dopant, such as boron (Br), aluminum (Al), gallium (Ga), or the like, or may alternatively be doped with an n-type dopant, as is known in the art. In some embodiments, the substrate 20 may include a doped epitaxial layer. Shallow trench isolation (STI) regions (not shown) may be formed in the substrate 20 to isolate active regions (only one is schematically shown in FIG. 20 with numeral 201), such as source or drain regions of an integrated circuit device (not shown) in the substrate 20. In some embodiments, the integrated circuit device may include transistors (e.g., field-effect transistors (FETs), complementary metal-oxide semiconductor (CMOS) transistors, planar or vertical multi-gate transistors (e.g., FinFET devices), gate-all-around (GAA) devices, or the like), resistors, capacitors, diodes, interconnections, or the like, based on practical applications. In addition, through-vias (not shown) may be formed to extend into the substrate 20 for electrically connecting features on opposite sides of the substrate 20.

In accordance with some embodiments, a dielectric layer 202 is formed over the substrate 20, and a contact feature 203 is formed in the dielectric layer 202 and is electrically connected to the active region 201.

In accordance with some embodiments, subsequent to the provision of the substrate 20, a first dielectric layer 21 is formed over the dielectric layer 202 and is patterned to form an interconnect opening 212 exposing the contact feature 203. This process is illustrated as process 304 in the flow chart 300 shown in FIG. 19. In some embodiments, the first dielectric layer 21 has an inner lateral surface 211 that defines the interconnect opening 212. In some embodiments, the inner lateral surface 211 of the first dielectric layer 21 is substantially perpendicular to the substrate 20. In some embodiments, the first dielectric layer 21 includes undoped silicate glass (USG), phosphosilicate glass (PSG), borosilicate glass (BSG), boron-doped phosphosilicate glass (BPSG), fluorine-doped silicate glass (FSG), silicon dioxide ($SiO_2$), SiOC-based materials (e.g., SiOCH), or the like. In some embodiments, $SiO_2$ may be formed from TEOS. In some embodiments, the first dielectric layer 21 may be formed to be porous to lower the dielectric constant thereof. The first dielectric layer 21 may be formed using a suitable technique, such as spin-on coating, FCVD, PECVD, LPCVD, ALD, or the like. In some embodiments, the first dielectric layer 21 may include an anti-reflective layer (not shown), such as a nitrogen-free anti-reflective coating (NFARC), for preventing radiation used in a subsequent photolithographic process from reflecting off layers below and interfering with the exposure procedure. The NFARC may include a material such as silicon-rich oxide (SRO), or silicon oxygen carbide (i.e., carbon-doped silicon oxide). The NFARC may be formed by CVD or the like.

In accordance with some embodiments, a photoresist (not shown) may be used for patterning the first dielectric layer 21. The photoresist is first formed on the first dielectric layer 21, and is then patterned using a patterned mask. The photoresist may include a photosensitive material which undergoes a property change when exposed to light. The property change may be used to selectively remove exposed or unexposed portions of the photoresist in a photolithographic patterning process. In some embodiments, a photolithographic system exposes the photoresist to radiation. Radiation light passing through the patterned mask strikes the photoresist to thereby transfer a layout of the patterned mask to the photoresist. In some embodiments, the photoresist may be patterned using a direct writing or maskless lithographic technique, such as laser patterning, e-beam patterning, ion-beam patterning, or the like. After the exposure step, the photoresist is then developed, leaving the exposed portions of the photoresist, or in alternative examples, leaving the unexposed portions of the photoresist. In some embodiments, the patterning process may include multiple steps, such as soft baking of the photoresist, mask alignment, exposure, post-exposure baking, developing of the photoresist, rinsing, and drying (e.g., hard baking). Each of the steps may be repeated or omitted according to practical requirements. The patterned photoresist exposes portions of the first dielectric layer 21 to be etched. In some embodiments, the etching process may include an anisotropic (i.e., directional) etching configured to etch vertically through the first dielectric layer 21 without substantial horizontal etching. Accordingly, the etching process may include any suitable etching technique, such as dry etching, wet etching, reactive ion etching (RIE), ashing, or the like. The etching process may use any suitable etchant, and the particular etchant or etchants may depend on the materials of the first dielectric layer 21 being used.

Figure 21:
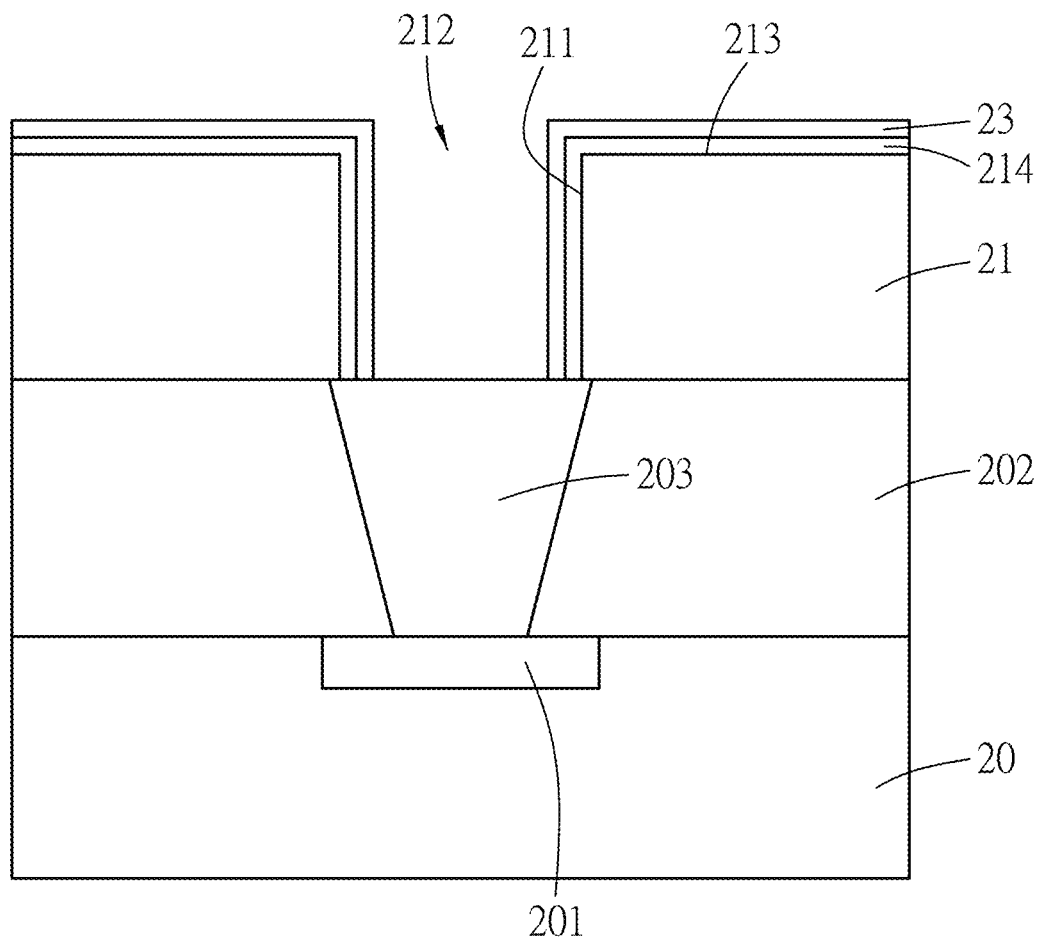

FIG. 21 illustrates that, after the first dielectric layer 21 is patterned to form the interconnect opening 212, a metal layer 23 is selectively formed on the inner lateral surface 211 of the first dielectric layer 21 and an upper surface 213 of the first dielectric layer 21, and is not formed on the contact feature 203. This process is illustrated as process 306 in the flow chart 300 shown in FIG. 19. In some embodiments, the metal layer 23 includes a catalyst material which contains Co, Ni, Ru, Rh, Pd, Re, Cu, Ag, Ir, Pt, Au, Ti, Hf, Ta, W, Mo, Fe, or combinations thereof. In some embodiments, the catalyst material of the metal layer 23 further contains a silane group such that the metal layer 23 is selectively formed on the first dielectric layer 21 and not on the contact feature 203. In some embodiments, the metal layer 23 may react with the first dielectric layer 21 to form a metal silicate layer 214. In some embodiments, the metal silicate layer 214 may be electrically insulating, and may serve as a barrier layer.

Figure 22:
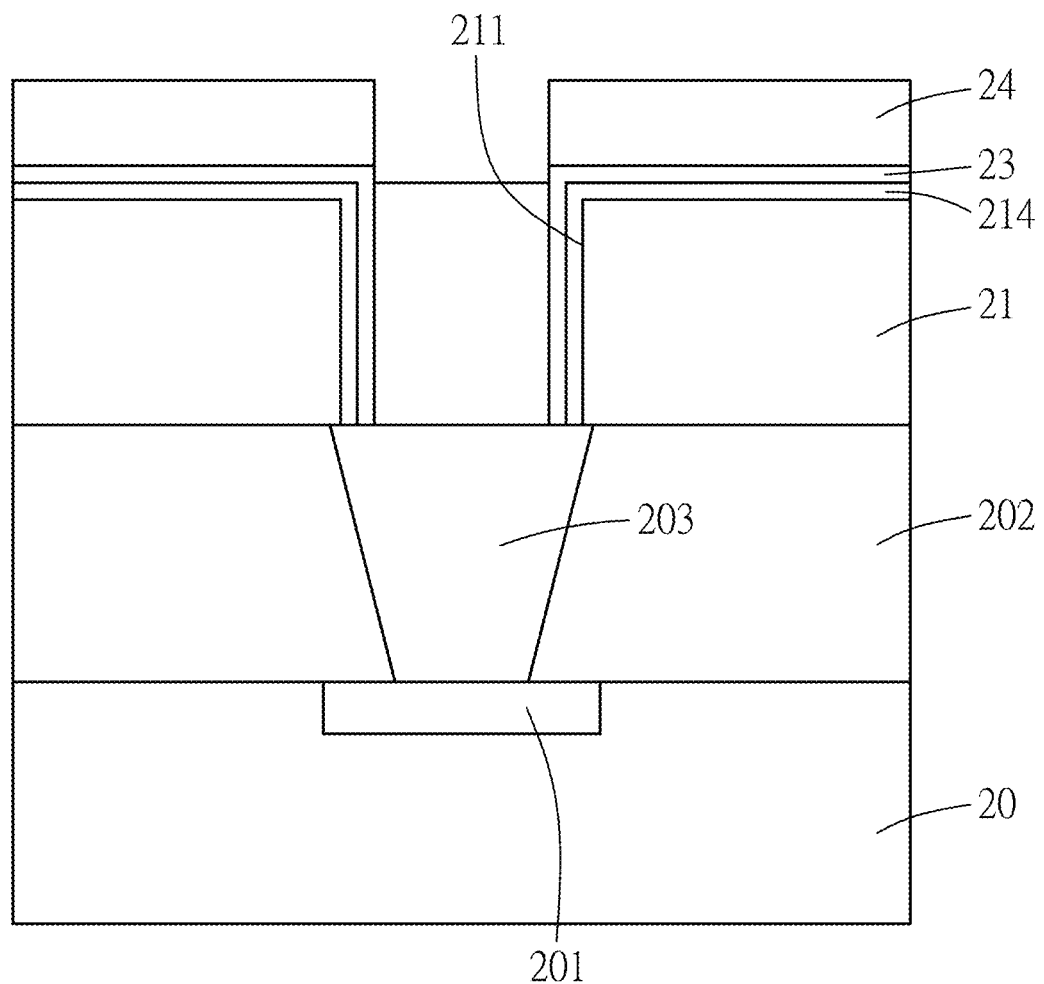

FIG. 22 illustrates that, after the formation of the metal layer 23, a graphene conductive structure 24 is formed on the metal layer 23 and fills the interconnect opening 212 (see FIG. 21). This process is illustrated as process 308 in the flow chart 300 shown in FIG. 19. In accordance with some embodiments, the graphene conductive structure 24 may be deposited using PECVD with one of radio frequency (RF) plasma, direct current (DC) plasma, inductively coupled plasma (ICP), microwave (MW) plasma, electron cyclotron resonance (ECR) plasma, or the like. In alternative embodiments, the graphene conductive structure 24 may be deposited using thermal CVD. In some embodiments, temperature of the deposition process may range from about room temperature to about 1000° C. In some embodiments, the graphene deposition process is PECVD to allow the deposition to take place at a temperature below about 400° C., thereby minimizing the influence of high temperature on IC devices (not shown) in the substrate 20. In some embodiments, precursors for depositing the graphene conductive structure 24 may include CO, $CH_4$, $C_2H_2$, $CF_4$, $C_2F_6$, $CHF_3$, aromatic compound (e.g., benzene, pyridine, or the like), derivatives thereof, or the like.

Figure 23:
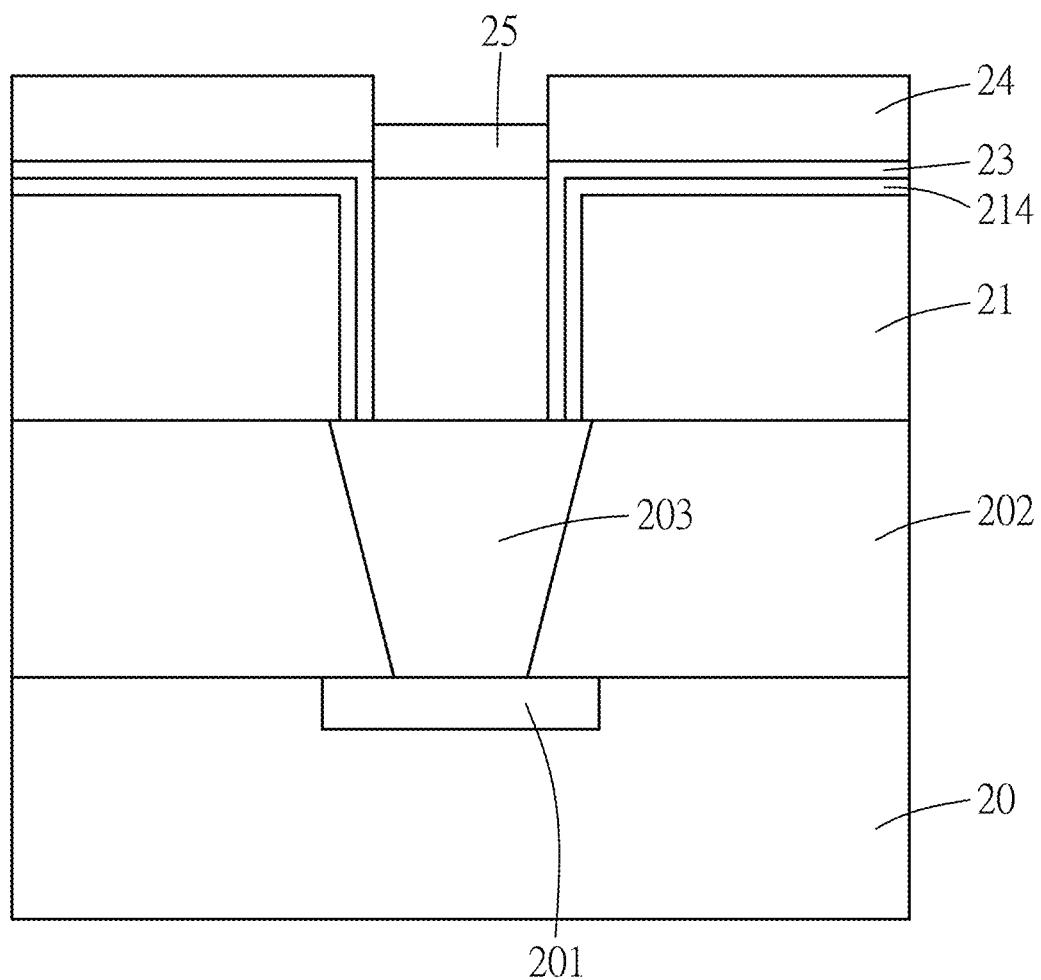

FIG. 23 illustrates that, after the formation of the graphene conductive structure 24, a hardmask 25 is formed to cover the graphene conductive structure 24 in the interconnect opening 212 (see FIG. 21). The process is illustrated as process 310 in the flow chart 300 shown in FIG. 19. In some embodiments, the hardmask 25 may be made of suitable metal oxide or metal nitride, such as TiN, WC, or the like, and the hardmask 25 may be formed by suitable techniques, such as PVD, CVD, ALD, or the like.

Figure 24:
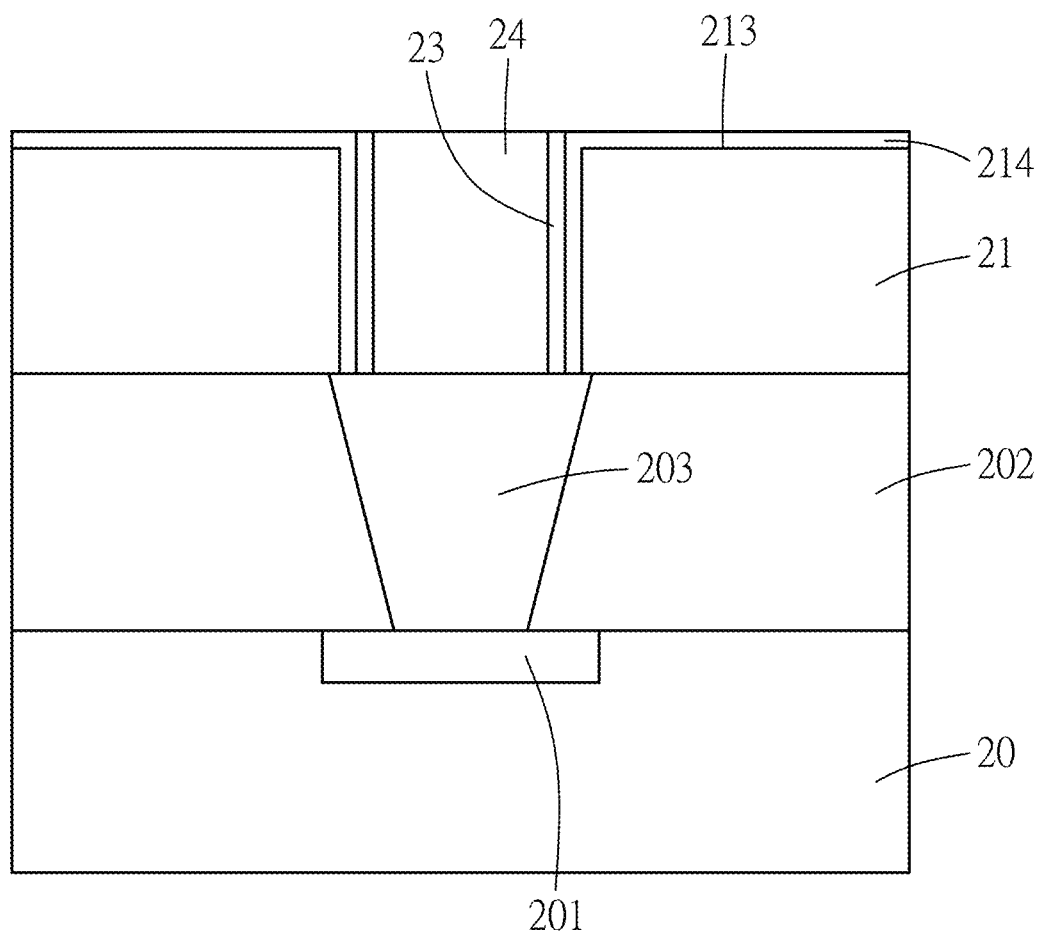

FIG. 24 illustrates that, after the formation of the hardmask 25, the graphene conductive structure 24 is patterned such that the graphene conductive structure 24 on the upper surface 213 of the first dielectric layer 21 is removed, followed by removing the metal layer 23 on the upper surface 213 and the hardmask 25 (see FIG. 23). These processes are respectively illustrated as processes 312 and 314 in the flow chart 300 shown in FIG. 19. In some embodiments, the graphene conductive structure 24 on the upper surface 213 may be removed by oxygen-containing plasma, and the metal layer 23 on the upper surface 213 may be oxidized by the oxygen-containing plasma. In some embodiments, the metal layer 23 on the upper surface 213 and the hardmask 25 may be removed by wet process using suitable chemicals, such as oxidant (e.g., $H_2O_2$ solution), or the like.

In some embodiments, after process 314 of the flow chart 300 of FIG. 19, processes 120, 122, 124, 126 and 128 of the flow chart 100 of FIG. 2 may be conducted.

Figure 25:
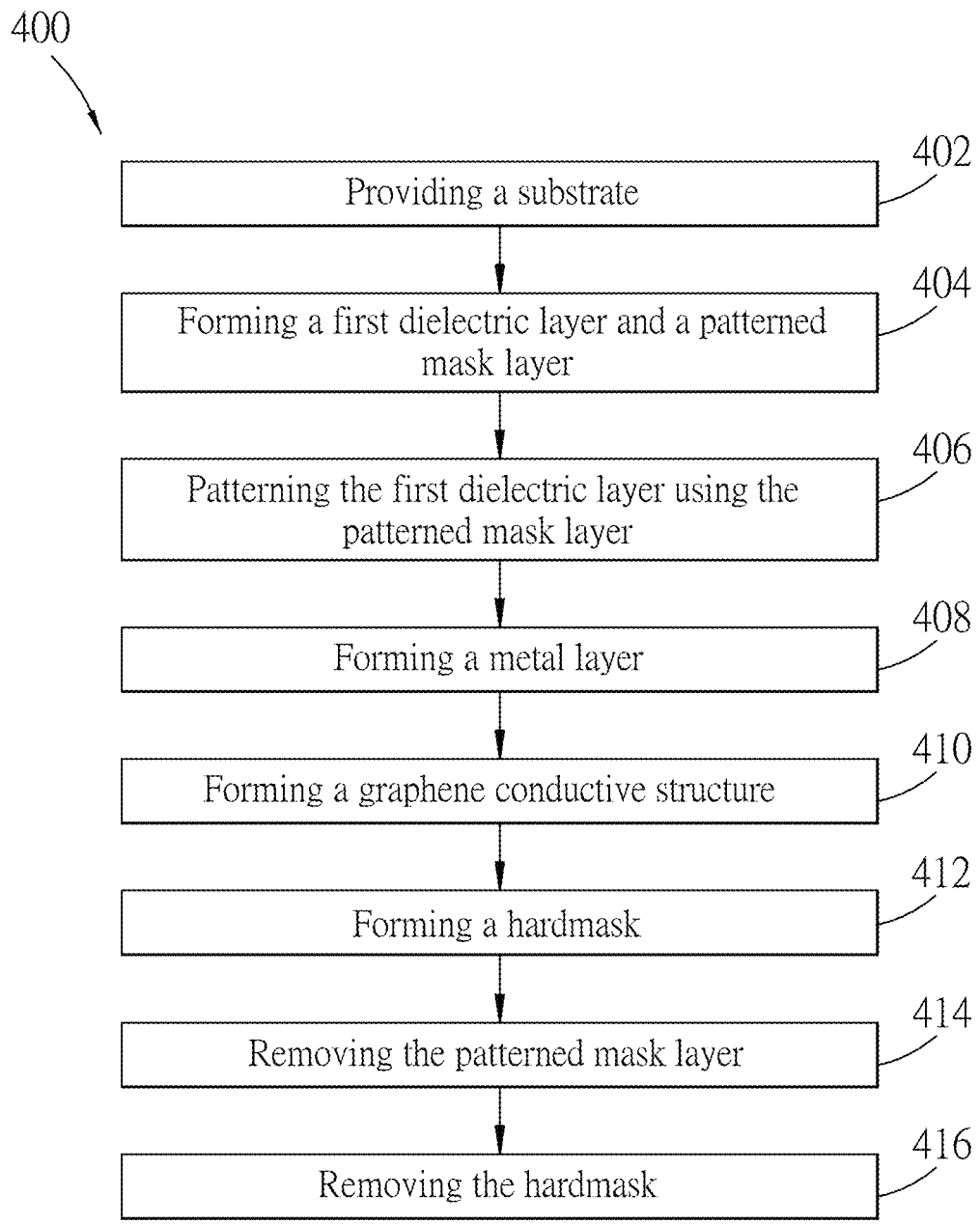
FIG. 25 illustrates a process flow for making a semiconductor structure in accordance with some embodiments.

FIGS. 26 to 31 illustrate schematic views of intermediate steps in the formation of a semiconductor structure in accordance with some embodiments. The corresponding processes are also reflected in the flow chart 400 as shown in FIG. 25.

Figure 26:
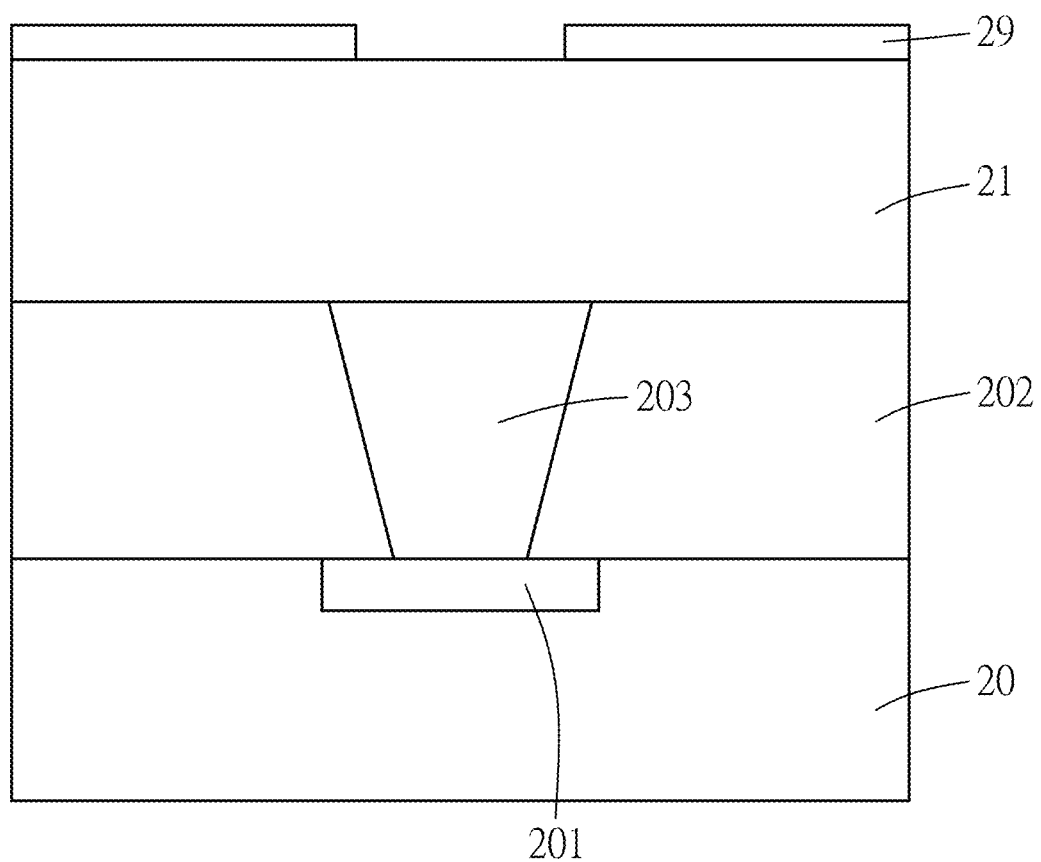
FIGS. 26 through 31 illustrate schematic views of stages in the formation of a semiconductor structure in accordance with some embodiments.

As shown in FIG. 26, in accordance with some embodiments, a substrate 20 is provided. This process is illustrated as process 402 in the flow chart 400 shown in FIG. 25. In some embodiments, the substrate 20 may be a semiconductor substrate, e.g., an elemental semiconductor or a compound semiconductor. An elemental semiconductor is composed of single species of atoms, such as silicon (Si) and germanium (Ge) in column IV of the periodic table. A compound semiconductor is composed of two or more elements, such as silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or the like. The compound semiconductor may have a gradient feature in which the composition changes from one ratio at one location to another ratio at another location in the compound semiconductor. The compound semiconductor may be formed over a silicon substrate. The compound semiconductor may be strained. In some embodiments, the substrate 20 may include a multi layer compound semiconductor structure. Alternatively, the substrate 20 may include a non-semiconductor material, such as a glass, fused quartz, or calcium fluoride. Furthermore, in some embodiments, the substrate 20 may be a semiconductor on insulator (SOI) (e.g., silicon germanium on insulator (SGOI)). Generally, an SOI substrate includes a layer of a semiconductor material such as epitaxial silicon (Si), germanium (Ge), silicon germanium (SiGe), or combinations thereof. The substrate 20 may be doped with a p-type dopant, such as boron (Br), aluminum (Al), gallium (Ga), or the like, or may alternatively be doped with an n-type dopant, as is known in the art. In some embodiments, the substrate 20 may include a doped epitaxial layer. Shallow trench isolation (STI) regions (not shown) may be formed in the substrate 20 to isolate active regions (only one is schematically shown in FIG. 26 with numeral 201), such as source or drain regions of an integrated circuit device (not shown) in the substrate 20. In some embodiments, the integrated circuit device may include transistors (e.g., field-effect transistors (FETs), complementary metal-oxide semiconductor (CMOS) transistors, planar or vertical multi-gate transistors (e.g., FinFET devices), gate-all-around (GAA) devices, or the like), resistors, capacitors, diodes, interconnections, or the like, based on practical applications. In addition, through-vias (not shown) may be formed to extend into the substrate 20 for electrically connecting features on opposite sides of the substrate 20.

In accordance with some embodiments, a dielectric layer 202 is formed over the substrate 20, and a contact feature 203 is formed in the dielectric layer 202 and is electrically connected to the active region 201.

In accordance with some embodiments, subsequent to the provision of the substrate 20, a first dielectric layer 21 is formed over the dielectric layer 202 and a patterned mask layer 29 is formed over the first dielectric layer 21. This process is illustrated as process 404 in the flow chart 400 shown in FIG. 25. In some embodiments, the first dielectric layer 21 includes undoped silicate glass (USG), phosphosilicate glass (PSG), borosilicate glass (BSG), boron-doped phosphosilicate glass (BPSG), fluorine-doped silicate glass (FSG), silicon dioxide ($SiO_2$), SiOC-based materials (e.g., SiOCH), or the like. In some embodiments, $SiO_2$ may be made of TEOS. In some embodiments, the first dielectric layer 21 may be formed to be porous to lower the dielectric constant thereof. The first dielectric layer 21 may be formed using a suitable technique, such as spin-on coating, FCVD, PECVD, LPCVD, ALD, or the like. In some embodiments, the first dielectric layer 21 may include an anti-reflective layer (not shown), such as a nitrogen-free anti-reflective coating (NFARC), for preventing radiation used in a subsequent photolithographic process from reflecting off layers below and interfering with the exposure procedure. The NFARC may include a material such as silicon-rich oxide (SRO), or silicon oxygen carbide (i.e., carbon-doped silicon oxide). The NFARC may be formed by CVD or the like.

In some embodiments, the mask layer 29 may include a metal material, a metallic compound (e.g., a metal oxide, a metal nitride, a metal carbide, or the like), a dielectric material (e.g., a semiconductor oxide, a semiconductor nitride, a semiconductor carbide, or the like), and/or other suitable materials. In some embodiments, the mask layer 29 may be formed by any suitable process including CVD, PVD, ALD, spin-on coating, and/or other suitable techniques, and may be formed to have any suitable thickness. Then, the mask layer 29 may be patterned by any suitable etching technique, such as dry etching, wet etching, reactive ion etching (RIE), ashing, or the like. The etching process may use any suitable etchant, and the particular etchant or etchants may depend on the materials of the mask layer 29 being used.

Figure 27:
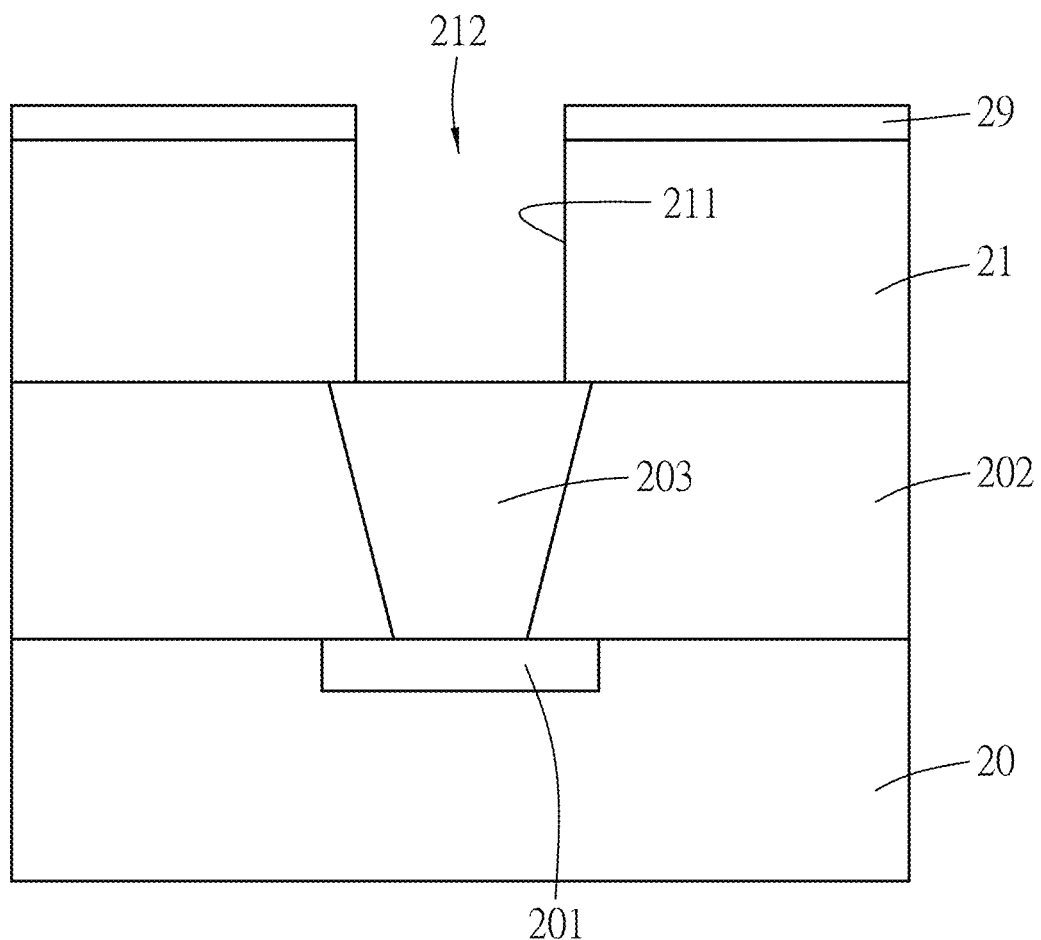

FIG. 27 illustrates that, after the formation of the first dielectric layer 21 and the patterned mask layer 29, the first dielectric layer 21 is patterned using the patterned mask layer 29 as a mask to form an interconnect opening 212, which is defined by an inner lateral surface 211 of the first dielectric layer 21. This process is illustrated as process 406 in the flow chart 400 shown in FIG. 25. The first dielectric layer 21 may be patterned by any suitable etching technique, such as dry etching, wet etching, reactive ion etching (RIE), ashing, or the like. The etching process may use any suitable etchant, and the particular etchant or etchants may depend on the materials of the first dielectric layer 21 being used.

Figure 28:
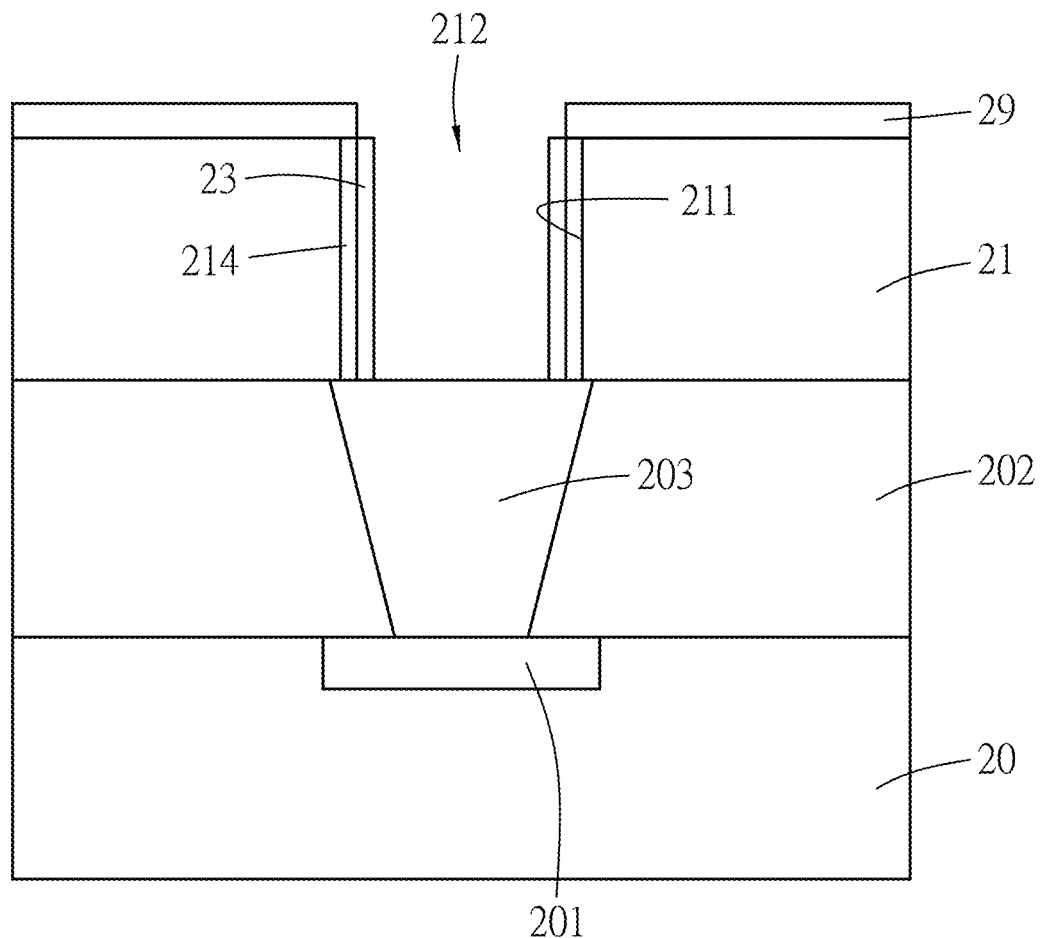

FIG. 28 illustrates that, after the patterning of the first dielectric layer 21, a metal layer 23 is selectively formed on the inner lateral surface 211 of the first dielectric layer 21, and is not formed on the contact feature 203 and the patterned mask layer 29. This process is illustrated as process 408 in the flow chart 400 shown in FIG. 25. In some embodiments, the patterned mask layer 29 contains metal, and the metal layer 23 is deposited from a silane-containing material such that the metal layer 23 is selectively formed on the first dielectric layer 21 and not on the contact feature 203 and the patterned mask layer 29. In some embodiments, the metal layer 23 may include Co, Ni, Ru, Rh, Pd, Re, Cu, Ag, Ir, Pt, Au, Ti, Hf, Ta, W, Mo, Fe, or combinations thereof. In some embodiments, the metal layer 23 may react with the first dielectric layer 21 to form a metal silicate layer 214. In some embodiments, the metal silicate layer 214 may be electrically insulating, and may serve as a barrier layer.

Figure 29:
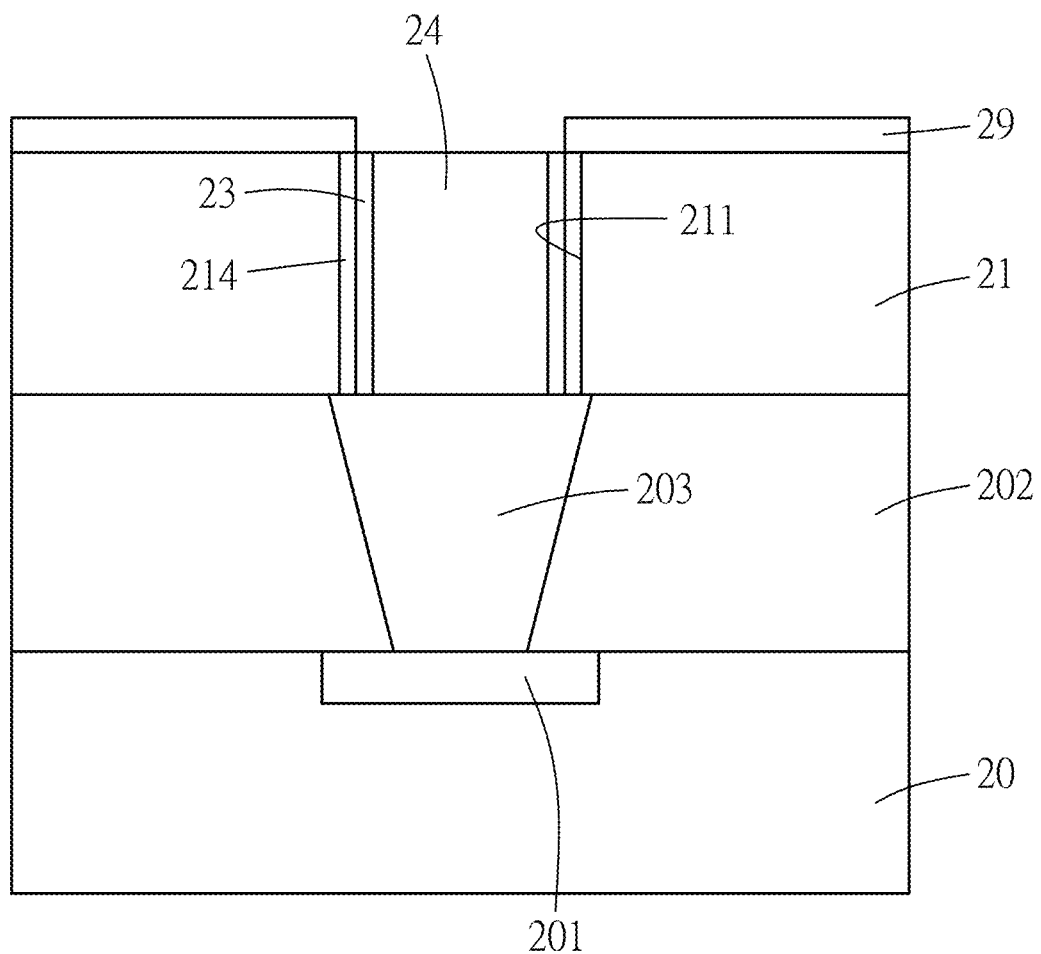

FIG. 29 illustrates that, after the formation of the metal layer 23, a graphene conductive structure 24 is formed on the metal layer 23 and fills the interconnect opening 212 (see FIG. 28). This process is illustrated as process 410 in the flow chart 400 shown in FIG. 25. In accordance with some embodiments, the graphene conductive structure 24 may be deposited using PECVD with one of radio frequency (RF) plasma, direct current (DC) plasma, inductively coupled plasma (ICP), microwave (MW) plasma, electron cyclotron resonance (ECR) plasma, or the like. In alternative embodiments, the graphene conductive structure 24 may be deposited using thermal CVD. In some embodiments, temperature of the deposition process may range from room temperature to about 1000° C. In some embodiments, the graphene deposition process is PECVD to allow the deposition to take place at a temperature below about 400° C., thereby minimizing the influence of high temperature on IC devices (not shown) in the substrate 20. In some embodiments, precursors for depositing the graphene conductive structure 24 may include CO, $CH_4$, $C_2H_2$, $CF_4$, $C_2F_6$, $CHF_3$, aromatic compound (e.g., benzene, pyridine, or the like), derivatives thereof, or the like.

Figure 30:
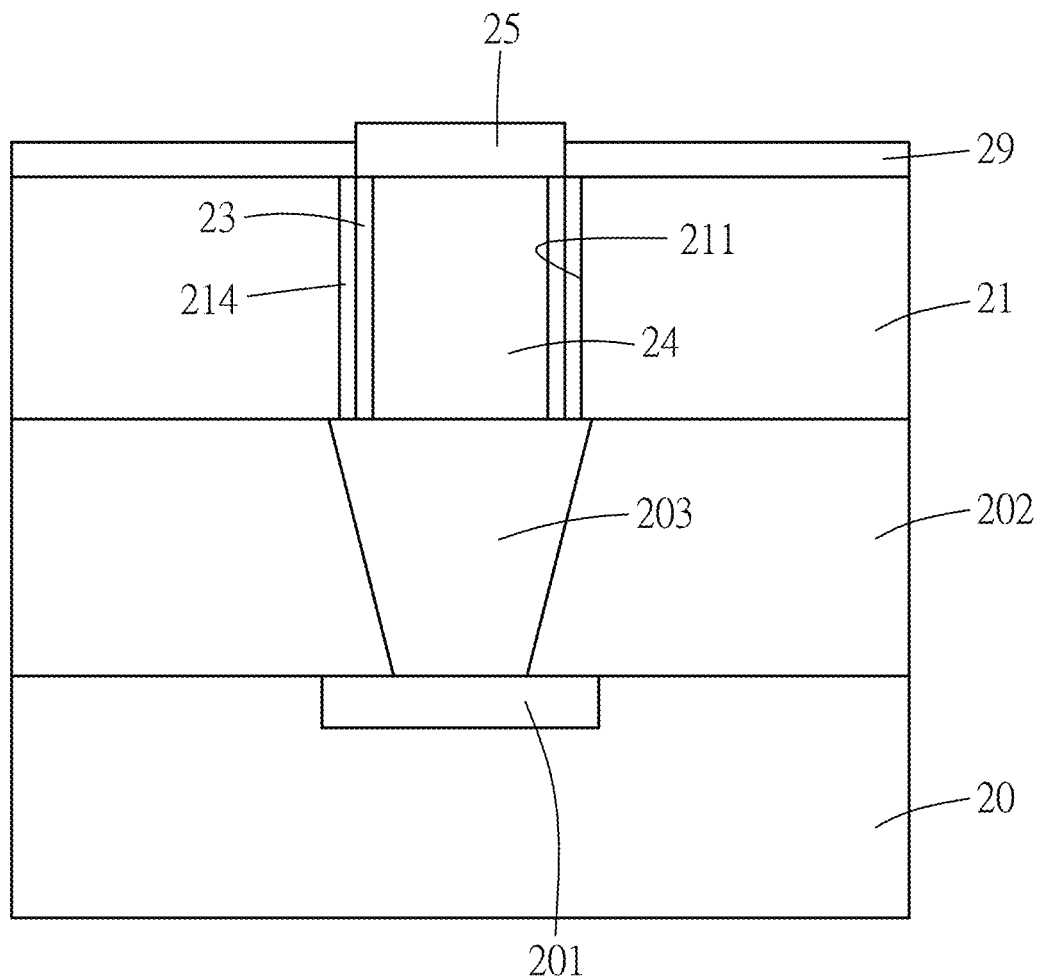

FIG. 30 illustrates that, after the formation of the graphene conductive structure 24, a hardmask 25 is formed to cover the graphene conductive structure 24 in the interconnect opening 212 (see FIG. 28). The process is illustrated as process 412 in the flow chart 400 shown in FIG. 25. In some embodiments, the hardmask 25 may be made of suitable metal oxide or metal nitride, such as TiN, WC, or the like, and the hardmask 25 may be formed by suitable techniques, such as PVD, CVD, ALD, or the like.

Figure 31:
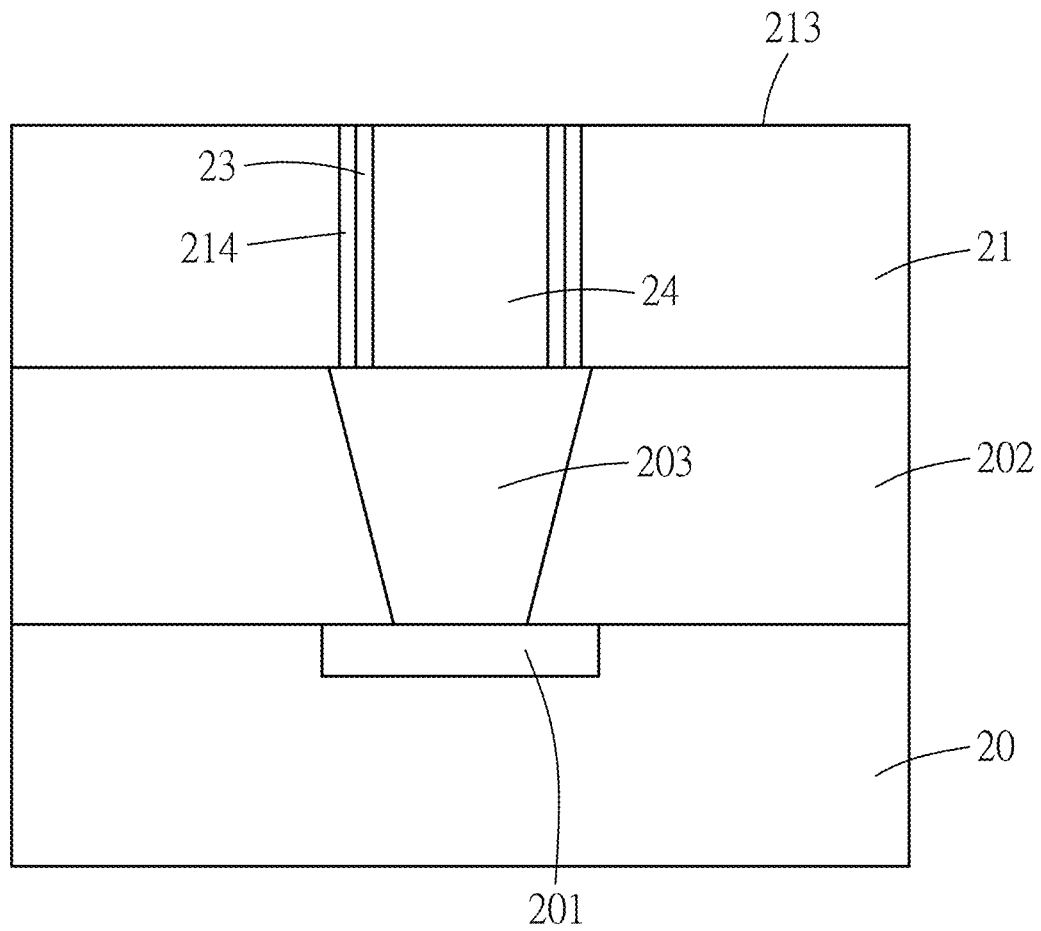

FIG. 31 illustrates that, after the hardmask 25 is formed, the patterned mask layer 29 is removed, followed by removing the hardmask 25 (see FIG. 30). These processes are respectively illustrated as processes 414 and 416 in the flow chart 400 shown in FIG. 25. In some embodiments, the patterned mask layer 29 may be removed by suitable etching techniques, such as wet etching. In some embodiments, the hardmask 25 may be removed by wet process using suitable chemicals, such as oxidant (e.g., $H_2O_2$ solution), or the like.

In some embodiments, after process 416 of the flow chart 400 of FIG. 25, processes 120, 122, 124, 126 and 128 of the flow chart 100 of FIG. 2 may be conducted.

The embodiments of the present disclosure have some advantageous features. The graphene conductive structure according to this disclosure is directly grown in the interconnect opening from the metal layer on the inner lateral surface and has at least one graphene layer extending in a direction parallel to the inner lateral surface (i.e., substantially perpendicular to the substrate). Such graphene conductive structure can be formed to fill the interconnect opening with small opening or large aspect ratio without gap-fill issues (e.g., formation of voids in metal filled in the interconnect opening). In addition, the graphene conductive structure according to this disclosure has a robust covalent bond structure, which allows the semiconductor structure to be more durable. Moreover, the graphene conductive structure provides a good electric conduction path without suffering from high resistance issues caused by grain boundaries of some metals when the device dimension shrinks. With the dielectric layer and metal layer, the vertical graphene conductive structure can be easily formed into a desirable shape without the need to etch the vertical graphene conductive structure. Furthermore, since doping/intercalating direction is substantially parallel to the extending direction of the graphene layers of the graphene conductive structure, the intercalating material can be easily and efficiently doped or intercalated into the graphene conductive structure so as to improve electrical conductivity of the graphene conductive structure or to adjust the electrical conductivity of the graphene conductive structure to desirable values. In addition, the metal silicate layer formed from reaction between the metal layer and the patterned first dielectric layer may serve as a barrier layer for metal layers above or below the metal silicate layer.

In accordance with some embodiments, a method for making a semiconductor structure includes: providing a substrate with a contact feature thereon; forming a dielectric layer on the substrate; etching the dielectric layer to form an interconnect opening exposing the contact feature; forming a metal layer on the dielectric layer and outside of the contact feature; and forming a graphene conductive structure on the metal layer, the graphene conductive structure filling the interconnect opening, being electrically connected to the contact feature, and having at least one graphene layer that extends in a direction substantially perpendicular to the substrate.

In accordance with some embodiments, a method for making a semiconductor structure includes: providing a substrate with a contact feature thereon; forming a dielectric layer on the substrate, the dielectric layer having a plurality of interconnect openings exposing the contact feature; selectively forming a plurality of metal layers respectively on side walls of the interconnect openings; and forming a plurality of graphene conductive structures respectively on the metal layers, the graphene conductive structures respectively filling the interconnect openings and being electrically connected to the contact feature, each of the graphene conductive structures having at least one graphene layer that extends in a direction substantially perpendicular to the substrate.

In accordance with some embodiments, a semiconductor structure includes a substrate with a contact feature thereon, a dielectric layer, a metal layer and a graphene conductive structure. The dielectric layer is disposed over the substrate. The metal layer is formed in the dielectric layer. The graphene conductive structure is formed in the dielectric layer, is connected to the metal layer, and is electrically connected to the contact feature. The graphene conductive structure has at least one graphene layer that extends in a direction substantially perpendicular to the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for making a semiconductor structure, comprising:
   providing a substrate with a contact feature thereon;
   forming a dielectric layer on the substrate;
   etching the dielectric layer to form an interconnect opening exposing the contact feature;
   forming a blocking layer in the interconnect opening to cover the contact feature with the blocking layer;
   forming a metal layer on the dielectric layer;

forming a graphene conductive structure on the metal layer, the graphene conductive structure filling the interconnect opening, being electrically connected to the contact feature, and having at least one graphene layer that extends in a direction substantially perpendicular to the substrate; and removing the blocking layer.

2. The method as claimed in claim 1, wherein in forming the metal layer, the metal layer is formed on the region outside of the blocking layer.

3. The method as claimed in claim 1, wherein the blocking layer is made of a self-assembling monolayer material that includes a head group containing phosphorous, sulfur, nitrogen, or any combinations thereof.

4. The method as claimed in claim 3, wherein the head group of the self-assembling monolayer material includes phosphonic acid, thiol, alkanolamine, or any combinations thereof.

5. The method as claimed in claim 3, wherein the self-assembling monolayer material further includes an end group connected to the head group, the end group including perfluoroalkyl, hydrocarbon, or a combination thereof.

6. The method as claimed in claim 1, wherein:
in forming the metal layer, the metal layer is further formed on an upper surface of the dielectric layer;
in forming the graphene conductive structure on the metal layer, the graphene conductive structure is further formed on the upper surface of the dielectric layer; and
the method further comprises, after forming the graphene conductive structure, removing a portion of the graphene conductive structure and a portion of the metal layer on the upper surface of the dielectric layer.

7. The method as claimed in claim 6, further comprising:
before removing the portion of the graphene conductive structure and the portion of the metal layer, forming a hardmask to cover the graphene conductive structure in the interconnect opening; and
after removing the portion of the graphene conductive structure and the portion of the metal layer, removing the hardmask to expose the graphene conductive structure in the interconnect opening.

8. The method as claimed in claim 1, wherein the metal layer includes Co, Ni, Ru, Rh, Pd, Re, Cu, Ag, Ir, Pt, Au, Ti, Hf, Ta, W, Mo, Fe, or any combinations thereof.

9. The method as claimed in claim 1, wherein the metal layer contains a silane group.

10. The method as claimed in claim 9, wherein, in etching the dielectric layer, the interconnect opening is formed by patterning a dielectric layer using a patterned mask layer as a mask.

11. The method as claimed in claim 10, wherein the patterned mask layer contains metal.

12. A method for making a semiconductor structure, comprising:
forming a first dielectric layer on a substrate, the first dielectric layer being formed with a contact feature therein;
forming a second dielectric layer on the first dielectric layer;
etching the second dielectric layer to form an interconnect opening exposing the contact feature;
forming a metal layer on the second dielectric layer, the metal layer reacting with the second dielectric layer to form a metal silicate layer connected between the metal layer and the second dielectric layer; and forming a graphene conductive structure on the metal layer, the graphene conductive structure filling the interconnect opening, being electrically connected to the contact feature, and having at least one graphene layer that extends in a direction substantially perpendicular to the substrate.

13. The method as claimed in claim 12, wherein the metal layer is selectively formed on an inner lateral surface and an upper surface of the second dielectric layer, the inner lateral surface of the second dielectric layer defining the interconnect opening.

14. The method as claimed in claim 13, wherein
in forming the graphene conductive structure on the metal layer, the graphene conductive structure is formed on the inner lateral surface and the upper surface of the second dielectric layer; and
the method further comprises, after forming the graphene conductive structure, removing a portion of the graphene conductive structure and a portion of the metal layer on the upper surface of the second dielectric layer.

15. The method as claimed in claim 12, wherein the metal layer is selectively formed on an inner lateral surface of the second dielectric layer, the inner lateral surface of the second dielectric layer defining the interconnect opening.

16. The method as claimed in claim 15, further comprising, before the metal layer is selectively formed on the inner lateral surface of the second dielectric layer, forming a patterned mask layer on an upper surface of the second dielectric layer so as to serve as a mask for etching the second dielectric layer to form the interconnect opening.

17. The method as claimed in claim 16, wherein
in forming the graphene conductive structure on the metal layer, the graphene conductive structure is formed on the inner lateral surface of the second dielectric layer; and
the method further comprises, after forming the graphene conductive structure, removing the patterned mask layer.

18. A method for making a semiconductor structure, comprising:
providing a substrate with a contact feature thereon;
forming a dielectric layer on the substrate;
etching the dielectric layer to form an interconnect opening exposing the contact feature;
forming a metal layer on the dielectric layer; and
forming a graphene conductive structure on the metal layer, the graphene conductive structure filling the interconnect opening, being electrically connected to the contact feature, and having at least one graphene layer that extends in a direction substantially perpendicular to the substrate,
the metal layer serving as a catalyst layer for growth of the graphene conductive structure and including a silane group such that the metal layer is selectively formed on the dielectric layer to expose the contact feature through the interconnect opening surrounded by the metal layer.

19. The method as claimed in claim 18, wherein in forming the metal layer, the metal layer reacts with the dielectric layer to form a metal silicate layer connected between the metal layer and the dielectric layer.

20. The method as claimed in claim 18, wherein, in etching the dielectric layer, the interconnect opening is formed by patterning a dielectric layer using a patterned mask layer as a mask.

* * * * *